United States Patent
Uchii et al.

(10) Patent No.: US 11,545,322 B2
(45) Date of Patent: Jan. 3, 2023

(54) GAS CIRCUIT BREAKER

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Toshiyuki Uchii, Yokohama Kanagawa (JP); Takato Ishii, Kawasaki Kanagawa (JP); Akira Shimamura, Yokohama Kanagawa (JP); Tomohiro Hasegawa, Yokohama Kanagawa (JP); Tomoyuki Yoshino, Yokohama Kanagawa (JP); Yuko Imazawa, Yokohama Kanagawa (JP)

(73) Assignees: Kabushiki Kaisha Toshiba, Tokyo (JP); Toshiba Energy Systems & Solutions Corporation, Kawasaki (JP)

( * ) Notice: Subject to any disclaimer, the term of this patent is extended or adjusted under 35 U.S.C. 154(b) by 0 days.

(21) Appl. No.: 17/288,875

(22) PCT Filed: Oct. 26, 2018

(86) PCT No.: PCT/JP2018/039836
§ 371 (c)(1),
(2) Date: Apr. 26, 2021

(87) PCT Pub. No.: WO2020/084754
PCT Pub. Date: Apr. 30, 2020

(65) Prior Publication Data
US 2021/0350990 A1 Nov. 11, 2021

(51) Int. Cl.
*H01H 33/70* (2006.01)
*H01H 33/88* (2006.01)
*H05K 9/00* (2006.01)

(52) U.S. Cl.
CPC ........ *H01H 33/7023* (2013.01); *H01H 33/88* (2013.01); *H05K 9/0079* (2013.01)

(58) Field of Classification Search
CPC .............. H01H 33/7023; H01H 33/42; H01H 33/7038; H01H 33/90; H05K 9/0079
(Continued)

(56) References Cited

U.S. PATENT DOCUMENTS 5,045,652 A * 9/1991 Yanabu ................. H01H 31/32
218/116
6,100,492 A * 8/2000 Zehnder ................ H01H 1/385
218/49

(Continued)

FOREIGN PATENT DOCUMENTS

| CN | 106133870 A | 11/2016 |
| EP | 3 125 265 A1 | 2/2017 |

(Continued)

*Primary Examiner* — William A Bolton
(74) *Attorney, Agent, or Firm* — Finnegan, Henderson, Farabow, Garrett & Dunner, LLP

(57) ABSTRACT

A gas circuit breaker includes a trigger electrode which is arranged to be movable between a first arc contactor and a second arc contactor, a compression chamber for pressurizing arc-extinguishing gas, the compression chamber being formed by a cylinder which has an outer wall and an inner wall, each being formed in a cylindrical shape, and which is provided to the second arc contactor, and a piston that slides between the outer wall and the inner wall in conjunction with the trigger electrode, and an insulation nozzle that guides the arc-extinguishing gas pressurized in the compression chamber to an arc ignited between the first arc contactor and the second arc contactor. The insulation nozzle is supported by the inner wall of the cylinder.

11 Claims, 5 Drawing Sheets

[CLOSED STATE]

(58) Field of Classification Search
USPC ........ 218/48, 31, 53, 57, 60, 61, 65, 68, 77, 218/79, 80, 90, 110, 146, 158
See application file for complete search history.

(56) References Cited

U.S. PATENT DOCUMENTS

| | | | | |
|---|---|---|---|---|
| 6,107,590 | A * | 8/2000 | Skindhoj | H01H 39/00 |
| | | | | 218/43 |
| 8,878,092 | B2 * | 11/2014 | Shimizu | H01H 33/182 |
| | | | | 218/46 |
| 9,997,314 | B2 | 6/2018 | Uchii et al. | |
| 2013/0270228 | A1 * | 10/2013 | Nakada | H01H 33/12 |
| | | | | 218/158 |
| 2014/0069891 | A1 | 3/2014 | Otani et al. | |
| 2014/0360984 | A1 * | 12/2014 | Moriyama | H01H 33/12 |
| | | | | 218/146 |
| 2015/0194280 | A1 | 7/2015 | Uchii et al. | |
| 2016/0211097 | A1 | 7/2016 | Uchii et al. | |

FOREIGN PATENT DOCUMENTS

| | | |
|---|---|---|
| JP | S61-14444 U | 1/1986 |
| JP | WO 2013/030963 A | 3/2013 |
| JP | 2014-72032 A | 4/2014 |
| JP | 2015-79635 A | 4/2015 |
| JP | 2015-185467 A | 10/2015 |
| WO | WO 2015/146390 A1 | 10/2015 |

* cited by examiner

GAS CIRCUIT BREAKER

FIELD

The present embodiment relates to a gas circuit breaker that breaks a current in a power system.

BACKGROUND

Circuit breaker is used to break current flowing through power supply lines in power system. The gas circuit breaker is arranged in the power supply lines to break current that flows when separating a system in which accident has occurred at the time of system accident.

As the gas circuit breaker described above, a puffer-type gas circuit breaker widely used. The puffer-type gas circuit breaker has a pair of electrodes arranged oppositely in a sealed container filled with arc-extinguishing gas. This pair of electrodes is driven by a driving device arranged outside the gas circuit breaker to open and close.

When the gas circuit breaker is opened to an open-state, this pair of electrodes is driven by the driving device arranged outside the gas circuit breaker, and is mechanically separated. However, since a high voltage is applied in the power system, an arc current continues flowing even after the pair of electrodes is mechanically separated. The puffer-type gas circuit breaker sprays arc-extinguishing gas in the sealed container to an arc, and extinguishes the arc, to break this arc current.

CITATION LIST

Patent Literature

[Patent Literature 1]
  Japanese Utility Model Laid-Open No. 61-14444
[Patent Literature 2]
  International Publication No. WO2013/030963
[Patent Literature 3]
  Japanese Patent Laid-Open No. 2014-72032
[Patent Literature 4]
  Japanese Patent Laid-Open No. 2015-185467

SUMMARY

In the gas circuit breaker described above, the current is broken when a moving electrode moves to be separated from a fixed electrode. An arc generated between the moving electrode and the fixed electrode is extinguished by spraying pressurized arc-extinguishing gas. The flow direction and the flow velocity of the arc-extinguishing gas are ensured by a nozzle made of an insulating material. Therefore, it is preferable that the nozzle is arranged in the vicinity of the moving electrode.

However, due to mechanical vibrations during movement of the moving electrode, the approach and separation of the moving electrode and the nozzle made of the insulating material are repeated. This may create a so-called triple junction (triple point) at which metal, an insulator, and the arc-extinguishing gas contact with one another. The electric field intensity becomes extremely high at the triple junction at which the metal, the insulator, and the arc-extinguishing gas contact with one another. As a result, there is a possibility that electric insulation performance of the gas circuit breaker is impaired.

Accordingly, it is preferable that the nozzle is arranged to be separated from the moving electrode with an appropriate distance. In addition, it is preferable that a separation distance between the nozzle and the moving electrode is ensured over time.

An objective of the present embodiment is to provide a gas circuit breaker that can reduce deformation of an insulation nozzle and leakage of arc-extinguishing gas compressed to be sprayed to an arc, and can more surely maintain electric insulation performance.

A gas circuit breaker of the present embodiment includes the following structure.

(1) A first arc contactor electrically connected to a first lead-out conductor connected to a power system.

(2) A second arc contactor electrically connected to a second lead-out conductor.

(3) A trigger electrode which is arranged to be movable between the first arc contactor and the second arc contactor, which ignites an arc generated between the first arc contactor and the trigger electrode along with a movement in a first half of a current breaking action, and which ignites the arc on the second arc contactor along with the movement in a latter half of the current breaking action.

(4) A compression chamber for pressurizing arc-extinguishing gas which includes the following configuration.

(4-1) A cylinder which has an outer wall and an inner wall, each being formed in a cylindrical shape, and which is provided to the second arc contactor.

(4-2) A piston that slides between the outer wall and the inner wall in conjunction with the trigger electrode.

(5) An insulation nozzle that guides the arc-extinguishing gas pressurized in the compression chamber to an arc ignited between the first arc contactor and the second arc contactor.

(6) The insulation nozzle is supported by the inner wall of the cylinder.

DETAILED DESCRIPTION

First Embodiment

1-1. Overall Configuration

Figure 1:
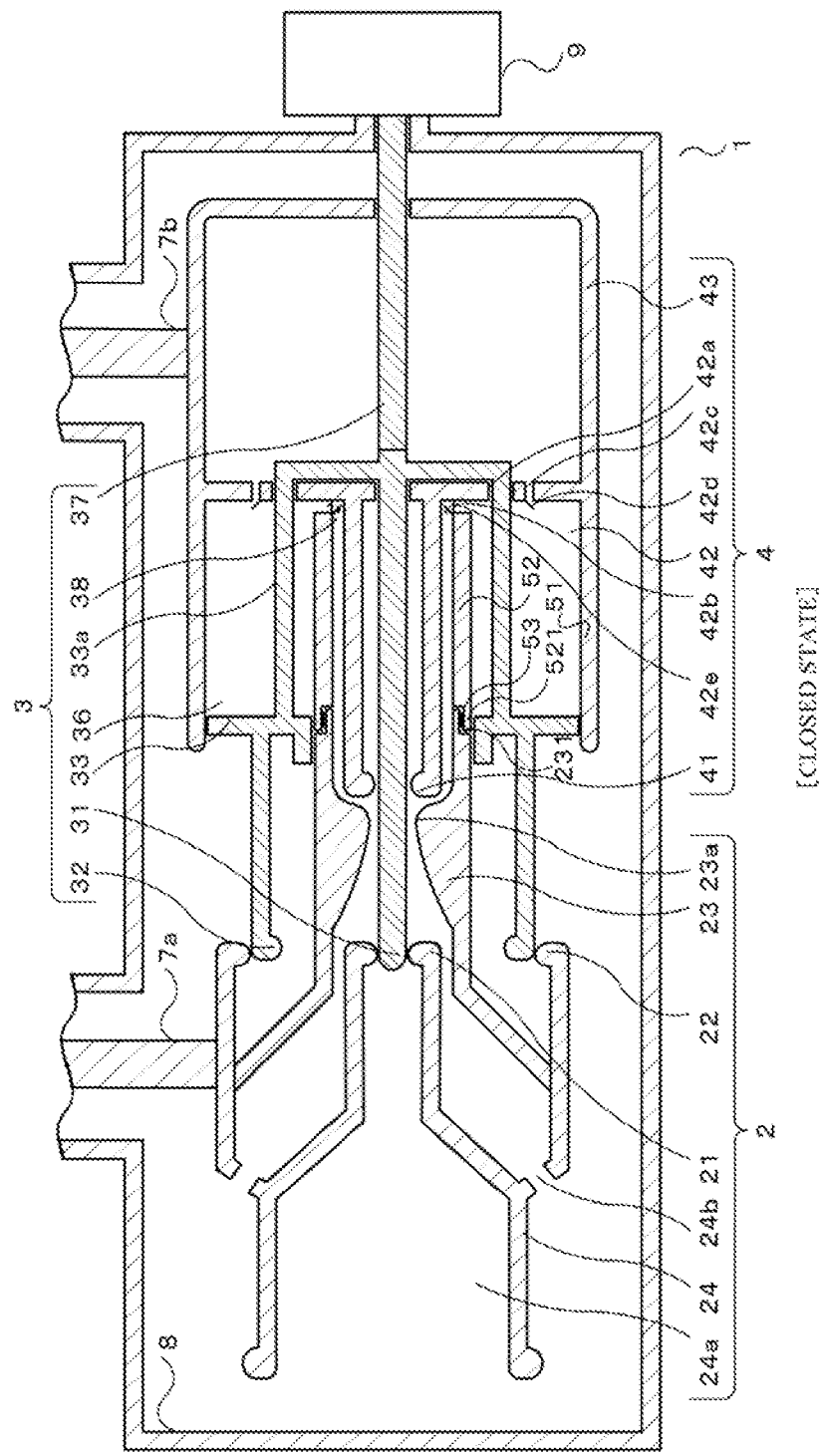
FIG. 1 is a diagram illustrating a closed state of a gas circuit breaker according to a first embodiment.
Figure 2:
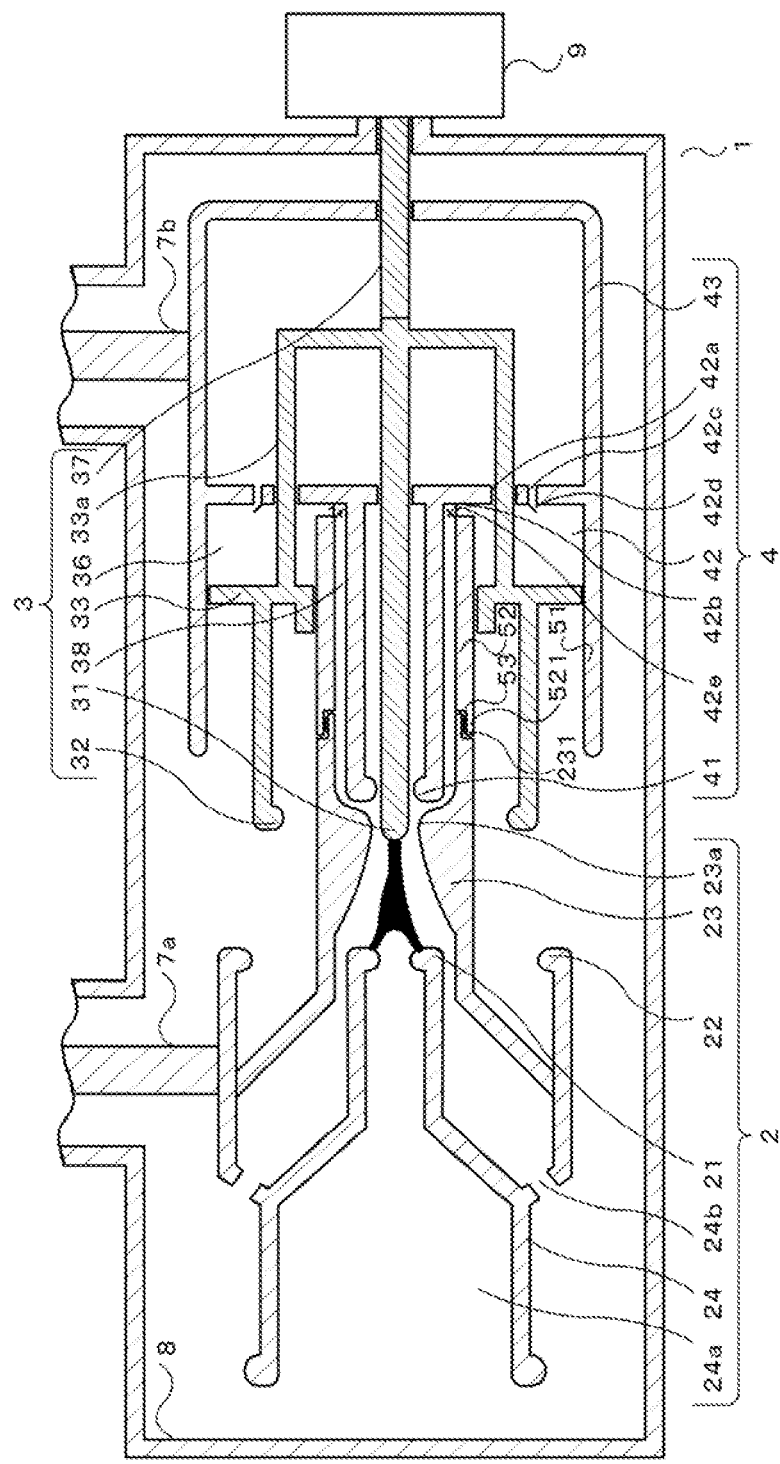
FIG. 2 is a diagram illustrating a first half of a current breaking action of the gas circuit breaker according to the first embodiment.
Figure 3:
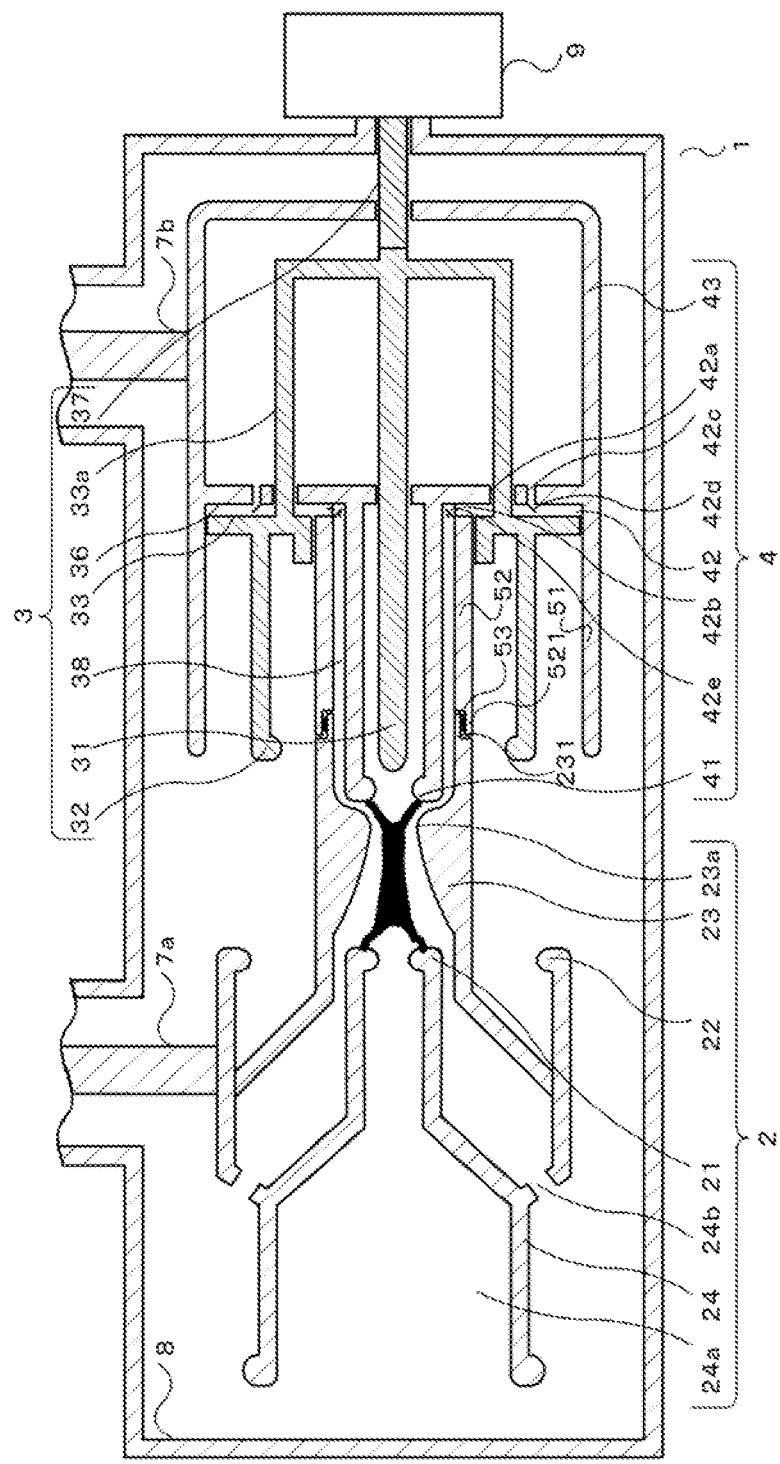
FIG. 3 is a diagram illustrating a latter half of the current breaking action of the gas circuit breaker according to the first embodiment.

Hereinafter, an entire configuration of a gas circuit breaker of the present embodiment will be described with reference to FIGS. 1 to 4. FIG. 1 illustrates an internal structure of the gas circuit breaker 1 in a closed state.

The gas circuit breaker 1 includes a first fixed contactor portion 2 (hereinafter, referred to as a fixed contactor portion 2), a movable contactor portion 3, a second fixed contactor portion 4 (hereinafter referred to as a fixed contactor portion 4), and an sealed container 8. A lead-out conductor 7a is connected to the fixed contactor portion 2 via the sealed container 8 and a lead-out conductor 7b is connected to the fixed contactor portion 2 and the fixed contactor portion 4 via the sealed container 8. The lead-out conductors 7a and 7b are connected to a power system. The gas circuit breaker 1 is installed in a power supply facility such as a substation.

The fixed contactor portion 2 and the fixed contactor portion 4 are a cylindrical member made of conductive metal. The movable contactor portion 3 is a cylindrical member made of conductive metal, and is arranged to be in close contact with inner diameter of the fixed contactor portion 2 and the fixed contactor portion 4 and to be slidable. The fixed contactor portion 2 and the fixed contactor portion 4 are fixed and separated by an insulator (not illustrated) in the sealed container 8.

The movable contactor portion 3 is a cylindrical member made of conductive metal. The movable contactor portion 3 is driven by a driving device 9 arranged outside the gas circuit breaker 1, and moves between the fixed contactor portion 2 and the fixed contactor portion 4 to electrically connect or disconnect the fixed contactor portion 2 and the fixed contactor portion 4. Accordingly, the lead-out conductors 7a and 7b is electrically connected or disconnected.

Note that, although the fixed contactor portion 2 is described as fixed and immovable, a configuration in which the fixed contactor portion 2 is driven relative to the movable contactor portion 3 is also possible. The structure becomes complicated, but an insulation distance between the fixed contactor portion 2 and the movable contactor portion 3 can be quickly increased in an opened state.

When the gas circuit breaker 1 becomes the opened state, an arc is generated between the fixed contactor portion 2 and the movable contactor portion 3. This arc is extinguished by spraying arc-extinguishing gas filled in the sealed container 8 with a high pressure.

The sealed container 8 is a cylindrical sealed container made of metal, glass, etc., and the arc-extinguishing gas is filled therein. As the arc-extinguishing gas, sulfur hexafluoride gas (SF6 gas) with excellent arc extinguishing performance and insulation performance is used. When being made of metal, the sealed container 8 is connected to a ground potential. A pressure inside the sealed container 8 is a single pressure, for example a filling pressure of the arc-extinguishing gas, at any portion of the sealed container 8 in the normal operation.

The arc-extinguishing gas is electrical insulation gas for extinguishing the arc. Currently, SF6 gas is used as the arc-extinguishing gas in many cases. However, SF6 gas has high global warming effect. Accordingly, instead of SF6 gas, other gas may be used as the arc-extinguishing gas. It is preferable that arc-extinguishing gas serving as substitute for SF6 gas has excellent insulation performance, arc cooling performance (arc extinguishing performance), chemical stability, environmental compatibility, and availability, cost, etc. According to the present embodiment illustrated in FIGS. 1 to 3, since the gas to be sprayed is pressurized by adiabatic compression, it is preferable that the arc-extinguishing gas serving as a substitute for SF6 gas is gas having a high heat capacity ratio which the pressure of the gas tends to increase at the same cylinder capacity and compression ratio.

The driving device 9 is a device for driving the movable contactor portion 3 to open and close the gas circuit breaker 1. The driving device 9 has a power source therein, and as the power source, a spring, a hydraulic pressure, high-pressure gas, or an electric motor, etc., is applied. The movable contactor portion 3 is moved between the fixed contactor portion 2 and fixed contactor portion 4 by the driving device 9, so that the fixed contactor portion 2 and the fixed contactor portion 4 are electrically disconnected from or connected to each other.

The driving device 9 is operated based on a command signal transmitted from the outside to open and close the gas circuit breaker 1. The driving device 9 is required to stably store large drive energy, to have extremely quick responsiveness to the command signal, and to perform a more reliable operation. The driving device 9 is not required to be placed in the arc-extinguishing gas.

When the gas circuit breaker 1 is in the opened state, it is preferable that a position of a piston 33 of the movable contactor portion 3 is held so that the piston 33 does not move reversely, until the arc-extinguishing gas pressurized in a compression chamber 36 to be described later is discharged to an arc space between an arc contactor (on a fixed side) 21 and an arc contactor (on a movable side) 41 through a pressure accumulating passage 38 to be described later, and the pressure inside the compression chamber 36 falls sufficiently. When the piston 33 moves reversely, a volume of the compression chamber 36 increases, and the pressures of the compression chamber 36 and the pressure accumulating passage 38 decrease. This is not preferable because a spraying pressure applied to the arc decreases. A reverse movement prevention structure may be provided in the driving device 9 to prevent this reverse movement.

The fixed contactor portion 2 is a cylindrical member that is arranged in the sealed container 8. The fixed contactor portion 2 includes the arc contactor (on a fixed side) 21, a fixed conductive contactor 22, an insulation nozzle 23, and an exhaust cylinder 24. The arc contactor (on the fixed side) 21 corresponds to a first arc contactor in the claims. Details of these members will be described later. The lead-out conductor 7a is connected to the fixed contactor portion 2 via the sealed container 8. The fixed contactor portion 2 is fixed and arranged to the sealed container 8. When the gas circuit breaker 1 is in the closed state, the fixed contactor portion 2 is electrically connected to the fixed contactor portion 4 via the movable contactor portion 3, and the current flows between the lead-out conductors 7a and 7b. On the other hand, when the gas circuit breaker 1 is in the opened state, the fixed contactor portion 2 is electrically disconnected from the movable contactor portion 3, and the current between the lead-out conductors 7a and 7b is broken.

The fixed contactor portion 4 is a cylindrical member arranged in the sealed container 8. The fixed contactor portion 4 includes an arc contactor (on the movable side) 41, a cylinder 42, and a support 43. The arc contactor (on the movable side) 41 corresponds to a second arc contactor in the claims. Note that the arc contactor (on the movable side) 41 itself is not movable. Details of these members will be described later. The lead-out conductor 7b is connected to the fixed contactor portion 4 via the sealed container 8. The fixed contactor portion 4 is fixed and arranged to the sealed container 8.

When the gas circuit breaker 1 is in the closed state, the fixed contactor portion 4 is electrically connected to the fixed contactor portion 2 via the movable contactor portion 3, and the current flows between the lead-out conductors 7a and 7b. On the other hand, when the gas circuit breaker 1 is in the opened state, the fixed contactor portion 4 is electrically disconnected from the fixed contactor portion 2 and the movable contactor portion 3, and the current between the lead-out conductors 7a and 7b is broken.

The movable contactor portion 3 is a cylindrical member arranged in the sealed container 8. The movable contactor portion 3 includes a trigger electrode 31, a movable conductive contactor 32, a piston 33, a piston support 33a, and an insulation rod 37. Details of these members will be described later. The movable contactor portion 3 is arranged to be reciprocally movable between the fixed contactor portion 2 and the fixed contactor portion 4.

The movable contactor portion 3 is mechanically connected to the driving device 9 arranged outside the gas circuit breaker 1. The movable contactor portion 3 is driven by the driving device 9 to open and close the gas circuit breaker 1, breaking and conducting the current flowing through the lead-out conductors 7a and 7b. When the gas circuit breaker 1 is in the closed state, the movable contactor portion 3 is electrically connected with the fixed contactor portion 2 and the fixed contactor portion 4, and the current flows between the lead-out conductors 7a and 7b. On the other hand, when the gas circuit breaker 1 is in the opened state, the movable contactor portion 3 is electrically disconnected from the fixed contactor portion 2, and the current between the lead-out conductors 7a and 7b is broken.

In addition, the movable contactor portion 3 compresses the arc-extinguishing gas accumulated in the cylinder 42 by the piston 33, and makes the arc-extinguishing gas to blowout from the insulation nozzle 23, the arc generated between the fixed contactor portion 2 and the movable contactor portion 3 is extinguished to break the arc current.

The fixed contactor portion 2, the movable contactor portion 3, the fixed contactor portion 4, and the sealed container 8 are concentric cylindrical members having a common center axis, and are arranged on the same axis. In below, to describe positional relation and direction of each member, a direction toward the fixed contactor portion 2 side is called an open-end direction, and a direction toward the fixed contactor portion 4 side opposite thereto is called driving-device direction.

1-2. Detailed Configuration

Fixed Contactor Portion 2

The fixed contactor portion 2 includes the arc contactor (on the fixed side) 21, the fixed conductive contactor 22, the insulation nozzle 23, and the exhaust cylinder 24. The arc contactor (on the fixed side) 21 corresponds to the first arc contactor in the claims. Furthermore, the arc contactor (on the fixed side) 21 may be also referred to herein as the first arc contactor.

Fixed Conductive Contactor 22

The fixed conductive contactor 22 is a ring-shape electrode arranged on an end surface of the fixed contactor portion 2 on an outer circumference portion in the driving-device direction. The fixed conductive contactor 22 is formed of a metal conductor formed into a ring shape bulging toward the inner diameter side by shaving, etc. The metal forming the fixed conductive contactor 22 is preferably aluminum in view of electric conductivity, lightweight property, strength, and workability, but otherwise, may be, for example, copper.

The fixed conductive contactor 22 has the inner diameter which is slidable and which has a constant clearance, relative to the outer diameter of the movable conductive contactor 32 of the movable contactor portion 3. The fixed conductive contactor 22 is arranged at an end of the exhaust cylinder 24, which is formed of cylindrical conductive metal, in the driving-device direction. The exhaust cylinder 24 is connected to the lead-out conductor 7a via the sealed container 8. The exhaust cylinder 24 is fixed to the sealed container by an insulation member.

When the gas circuit breaker 1 is in the closed state, the movable conductive contactor 32 of the movable contactor portion 3 is inserted into the fixed conductive contactor 22. Accordingly, the fixed conductive contactor 22 contacts with the movable conductive contactor 32, and the fixed contactor portion 2 and the movable contactor portion 3 are electrically connected to each other. When power is applied, a rated current flows through the fixed conductive contactor 22.

On the other hand, when the circuit breaker 1 is in the opened state, the fixed conductive contactor 22 is physically separated from the movable conductive contactor of the movable contactor portion 3, and the fixed contactor portion 2 and the movable contactor portion 3 are electrically disconnected from each other.

Arc Contactor (on a Fixed Side) 21

The arc contactor (on the fixed side) 21 is a cylindrical electrode arranged on an end of the fixed contactor portion 2 on the driving-device direction along the center axis of the cylinder of the fixed contactor portion 2. The arc contactor (on the fixed side) 21 is formed of a metal conductor which is formed into a cylindrical shape having a diameter smaller than that of the fixed conductive contactor 22 and which the end on the driving-device direction has a rounded shape. The arc contactor (on the fixed side) 21 is made of metal containing 10% to 40% of copper and 90% to 60% of tungsten, etc.

When the gas circuit breaker 1 is in the closed state, the arc contactor (on the fixed side) 21 contacts with an outer diameter portion of the trigger electrode 31 of the movable contactor portion 3. The arc contactor (on the fixed side) 21 is integrally fixed to the fixed contactor portion 2 by a support member provided on an inner wall surface of the exhaust cylinder 24 forming an outer circumference of the fixed contactor portion 2. The arc contactor (on the fixed side) 21 is arranged in the arc-extinguishing gas, and ignites an arc generated in the arc-extinguishing gas.

The arc contactor (on the fixed side) 21 is fixed, and does not contribute to a weight of a movable component which the driving device 9 should drive. Accordingly, a large heat capacity and a large surface area can be achieved, improving the durability of the arc contactor (on the fixed side) 21.

It is preferable that the durability of the arc contactor (on the fixed side) 21, the durability of the arc contactor (on the movable side) 41, and the durability of the trigger electrode 31 have the following relation.

The durability of the arc contactor (on the fixed side) 21≥the durability of the arc contactor (on the movable side) 41>the durability of the trigger electrode 31

This is because the arc contactor (on the fixed side) 21 is more likely to wear compared to the arc contactor (on the movable side) 41 for the arc-extinguishing gas flow that has become a high temperature is accelerated and thereafter collides with the arc contactor 21. In addition, this is because while it is preferable that the trigger electrode 31 that is a movable component is made more lightweight than he arc contactor (on the fixed side) 21 and the arc contactor (on the movable side) 41, a wear level of the trigger electrode 31 is small compared to that on the arc contactor (on the fixed side) 21 and that on the arc contactor (on the movable side) 41 for the high-temperature arc is ignited only for a certain period of time until the arc is commutated to the arc contactor (on the movable side) 41, as described below.

The arc contactor (on the fixed side) 21 is arranged to be separated from the arc contactor (on the movable side) 41 at a distance which the insulation can be ensured after the arc is extinguished. Since the arc contactor (on the fixed side) 21 and the arc contactor (on the movable side) 41 are fixed and are not movable, the arc contactor (on the fixed side) 21 and the arc contactor (on the movable side) 41 can be large in size. Therefore, the electric field in the space between the arc contactor (on the fixed side) 21 and the arc contactor (on the movable side) 41 has more uniform distribution (distribution with a lower concentration of the electric field) compared to the conventional technique, and the distance between the arc contactor (on the fixed side) 21 and the arc contactor (on the movable side) 41 can be made shorter than the conventional technique.

Furthermore, the flow rate and the flow velocity of the arc-extinguishing gas to be sprayed to the arc can be defined based on a distance between the insulation nozzle 23 and the arc contactor (on the fixed side) 21 and a distance between the insulation nozzle 23 and the arc contactor (on the movable side) 41. It is preferable that the distance between the arc contactor (on the fixed side) 21 and the insulation nozzle 23 is larger than the distance between the arc contactor (on the movable side) 41 and the insulation nozzle 23, because the arc-extinguishing gas sprayed to the arc can be easily and quickly exhausted in the open-end direction.

When the gas circuit breaker 1 is in the closed state, the trigger electrode 31 of the movable contactor portion 3 is inserted into the arc contactor (on the fixed side) 21. Accordingly, the arc contactor (on the fixed side) 21 contacts the trigger electrode 31 of the movable contactor portion 3, and the fixed contactor portion 2 and the movable contactor portion 3 are electrically connected to each other. When the gas circuit breaker 1 is in the closed state, the arc contactor (on the fixed side) 21 serves as a conductor forming a part of a current circuit, so that the lead-out conductors 7a and 7b are electrically connected to each other.

On the other hand, when the gas circuit breaker 1 is in the opened state, the arc contactor (on the fixed side) 21 is separated from the trigger electrode 31 of the movable contactor portion 3, and ignites an arc generated between the fixed contactor portion 2 and the movable contactor portion 3. The arc contactor (on the fixed side) 21 forms a pair of electrodes that are arranged to face the trigger electrode 31, and serves as one of electrodes that contact the arc when the gas circuit breaker 1 becomes the opened state. Since the fixed conductive contactor 22 and the movable conductive contactor 32 are separated from each other before the arc contactor (on the fixed side) 21 and the trigger electrode 31 are separated from each other and after the current is commutated to the arc contactor (on the fixed side) 21 side and the trigger electrode 31 side, the arc is not generated between the fixed conductive contactor 22 and the movable conductive contactor 32.

Since the arc contactor (on the fixed side) 21 and the trigger electrode 31 are separated from each other after the fixed conductive contactor 22 and the movable conductive contactor 32 are separated from each other, the arc is always ignited between the arc contactor (on the fixed side) 21 and the trigger electrode 31. This reduces the degradation of the fixed conductive contactor 22 and the movable conductive contactor 32 due to the arc.

When the gas circuit breaker 1 becomes the opened state, the movable contactor portion 3 is driven by the driving device 9, and moves between the arc contactor (on the fixed side) 21 and the arc contactor (on the movable side) 41 from the open-end direction side to the driving-device direction side. Accordingly, the trigger electrode 31 also moves between the arc contactor (on the fixed side) 21 and the arc contactor (on the movable side) 41 from the open-end direction side to the driving-device direction side. The fixed conductive contactor 22 and the movable conductive contactor 32 are separated from each other before the trigger electrode 31 is separated from the arc contactor (on the fixed side) 21. This is to prevent the arc from being generated between the fixed conductive contactor 22 and the movable conductive contactor 32.

The arc is generated between the trigger electrode 31 and the arc contactor (on the fixed side) 21 from a time point when the trigger electrode 31 starts to be separated from the arc contactor (on the fixed side) 21 until a separation distance between the arc contactor (on the fixed side) 21 and the arc contactor (on the movable side) 41 becomes equal to the separation distance between the arc contactor (on the fixed side) 21 and the trigger electrode 31.

When the separation distance between the arc contactor (on the fixed side) 21 and the arc contactor (on the movable side) 41 becomes approximately equal to the separation distance between the arc contactor (on the fixed side) 21 and the trigger electrode 31, the arc is transferred from the trigger electrode 31 to the arc contactor (on the movable side) 41. The arc is generated between the arc contactor (on the movable side) 41 and the arc contactor (on the fixed side) 21 from a time point when the separation distance between the arc contactor (on the fixed side) 21 and the arc contactor (on the movable side) 41 becomes approximately equal to the separation distance between the arc contactor (on the fixed side) 21 and the trigger electrode 31 until the arc is extinguished. At this time, the arc contactor (on the movable side) 41 and the arc contactor (on the fixed side) 21 form a pair of electrodes that are arranged to face each other, and ignite the arc.

The period of time from a time point when the trigger electrode 31 starts to be separated from the arc contactor (on the fixed side) 21 until the separation distance between the arc contactor (on the fixed side) 21 and the arc contactor (on the movable side) 41 becomes equal to the separation distance between the arc contactor (on the fixed side) 21 and the trigger electrode 31 may be referred to as a "first half of a current breaking action."

The period of time from a time point when the separation distance between the arc contactor (on the fixed side) 21 and the arc contactor (on the movable side) 41 becomes equal to the separation distance between the arc contactor (on the fixed side) 21 and the trigger electrode 31 until the arc is extinguished may be referred to as a "latter half of the current breaking action."

The trigger electrode 31 moves further in the driving-device direction, that is, in a direction in which the separation distance between the arc contactor (on the fixed side) 21 and the trigger electrode 31 becomes larger than the separation distance between the arc contactor (on the fixed side) 21 and the arc contactor (on the movable side) 41. This causes the trigger electrode 31 to be separated from the arc generated between the arc contactor (on the movable side) 41 and the arc contactor (on the fixed side) 21, reducing the degradation of the trigger electrode 31.

The trigger electrode 31 moves further in the driving-device direction. At this time, the arc-extinguishing gas pressurized in the compression chamber 36 that is formed by the piston 33 and the cylinder 42 is sprayed via the pressure accumulating passage 38 and the insulation nozzle 23, and the arc between the arc contactor (on the fixed side) 21 and the arc contactor (on the movable side) 41 is extinguished.

Note that a tip of the arc contactor (on the fixed side) 21 may be divided in a circumference direction to be a finger-like electrode. In this case, the arc contactor (on the fixed side) 21 is flexible, and the inner diameter of an opening edge of the arc contactor (on the fixed side) is slightly smaller than the outer diameter of the trigger electrode 31 and is narrowed. When the trigger electrode 31 is inserted into an opening of the arc contactor (on the fixed side) 21, the arc contactor (on the fixed side) 21 and the trigger electrode 31 contact each other, and are connected.

Insulation Nozzle 23

The insulation nozzle 23 is a cylindrical rectifying member having a throat portion 23a that defines a flow velocity balance of the arc-extinguishing gas pressurized in the compression chamber 36. The insulation nozzle 23 is a heat-resistant insulator such as polytetrafluoroethylene (PTFE) resin.

The insulation nozzle 23 is integrally fixed to the fixed contactor portion 2, and is arranged so that an axis of the cylinder of the insulation nozzle 23 is located on the cylindrical axis of the arc contactor (on the fixed side) 21. The insulation nozzle 23 is supported by an inner wall 52 of the cylinder 42 to be described later.

The insulation nozzle 23 has a step 231 on an outer circumference of an end on the driving-device direction side, so that the step 231 is fitted into a step 521 provided on an inner circumference of the inner wall 52 of the cylinder 42. The insulation nozzle 23 is supported by the inner wall 52 forming the cylinder 42 by fitting the step 231 on the insulation nozzle 23 into the step 521 on the inner wall 52 of the cylinder 42.

The step 231 corresponds to a first step in the claims, and the step 521 corresponds to a second step in the claims. In addition, the insulation nozzle 23 is supported by the inner wall 52 forming the cylinder 42 via an O-ring 53. The O-ring 53 ensures air-tightness between the insulation nozzle 23 and the inner wall 52 forming the cylinder 42.

It is preferable that a joining portion between the insulation nozzle 23 and the inner wall 52 and the inner wall 52 of the cylinder 42 are formed thin to reduce the pressure decrease of the arc-extinguishing gas compressed to be sprayed to the arc. It is preferable that the joining portion between the insulation nozzle 23 and the inner wall 52 and the inner wall 52 of the cylinder 42 are formed to have a thickness of about 15 mm or less.

If the joining portion between the insulation nozzle 23 and the inner wall 52 and the inner wall 52 of the cylinder 42 are formed thick, the deformation of the insulation nozzle 23 due to the high-pressure arc-extinguishing gas that has reached a high temperature is reduced. However, the pressure of the arc-extinguishing gas pressurized in the compression chamber 36 decreases when the arc-extinguishing gas flows into the pressure accumulating passage 38.

With a structure in which the outer circumference of the step 231 on the insulation nozzle 23 is fitted into the inner circumference of the step 521 on the inner wall 52 of the cylinder 42 so that the insulation nozzle 23 is supported by the inner wall 52 of the cylinder 42, the joining portion between the insulation nozzle 23 and the inner wall 52 and the inner wall 52 of the cylinder 42 can be formed thin. This can ensure the pressure of the arc-extinguishing gas when flowing into the pressure accumulating passage 38 from the compression chamber 36.

The trigger electrode 31 is joined with the movable conductive contactor 32 forming a main contact where an arc generated in a current breaking action is not ignited, and the insulation nozzle 23 is supported by and joined to the inner wall 52 forming the cylinder 42 in the driving-device direction with respect to the movable conductive contactor 32, i.e., at a position separated from the generated arc.

The insulation nozzle 23 is supported by and joined to the inner wall 52 forming the cylinder 42 at a position separated from the generated arc in the driving-device direction with respect to the movable conductive contactor 32.

The insulation nozzle 23 is arranged to surround the trigger electrode 31 when the gas circuit breaker 1 is in the closed state. The insulation nozzle 23 has a shape such that an interior thereof forms a conical space from the open-end direction side toward the driving-device direction side. The insulation nozzle 23 extends along the axis from the arc contactor (on the fixed side) 21 to the arc contactor (on the movable side) 41 side, and has the throat portion 23a which has a minimum diameter at between the arc contactor (on the fixed side) 21 and the arc contactor (on the movable side) 41.

The arc-extinguishing gas pressurized in the compression chamber 36 is guided to the arc space by the insulation nozzle 23. In addition, the arc-extinguishing gas is concentrated in the arc space by the throat portion 23a of the insulation nozzle 23, and the flow velocity of the arc-extinguishing gas is increased in the flow passage expanding from the throat portion 23a.

When the gas circuit breaker 1 becomes the opened state, the arc-extinguishing gas in the compression chamber 36 formed by the piston 33 of the movable contactor portion 3 and the cylinder 42 of the fixed contactor portion 4 is pressurized. The outer circumference of the arc contactor (on the movable side) 41 and the inner circumference of the inner wall 52 of the cylinder 42 form the pressure accumulating passage 38 which is a passage for the pressurized arc-extinguishing gas.

In an end stage of the pressurization process of the arc-extinguishing gas in the compression chamber 36, the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

At this time, the pressurized arc-extinguishing gas is concentrated in the arc space by the insulation nozzle 23. Accordingly, the arc between the arc contactor (on the movable side) 41 and the arc contactor (on the fixed side) 21 is efficiently extinguished, and the arc contactor (on the movable side) 41 and the arc contactor (on the fixed side) 21 are electrically disconnected from each other.

The arc-extinguishing gas that has been sprayed to the arc space between the arc contactor (on the fixed side) 21 and the arc contactor (on the movable side) 41 and become a high temperature is cooled by passing through the exhaust cylinder 24 of the fixed contactor portion 2, recovers the insulation performance, and is exhausted into the sealed container 8.

Thermal energy generated by the arc discharge is removed by the arc-extinguishing gas. As a result, the arc-extinguishing gas gains the thermal energy generated by the arc discharge, and becomes high temperature and high pressure. The arc-extinguishing gas that has become a high temperature and a high pressure is discharged from exhaust ports 24a and 24b of the exhaust cylinder 24, so that the thermal energy is eliminated from electrode regions.

The insulation nozzle 23 concentratedly guides the arc-extinguishing gas pressurized by the throat portion 23a to the arc space. Furthermore, the insulation nozzle 23 accelerates the arc-extinguishing gas in an expanded portion from the throat portion 23a, and improves the discharging performance of the thermal energy. In addition, the insulation nozzle 23 defines the exhaust passage of the arc-extinguishing gas heated to a high temperature by the arc, and for example, suppresses dielectric breakdown between the fixed conductive contactor 22 and the movable conductive contactor 32.

Furthermore, the insulation nozzle 23 suppresses expansion of the arc by using the throat portion 23a, and defines the minimum diameter of the arc at the throat portion 23a. The insulation nozzle 23 appropriately controls the flow rate and the flow velocity of the arc-extinguishing gas by using the throat portion 23a.

Therefore, the arc-extinguishing gas is efficiently sprayed to the arc generated between the arc contactor (on the movable side) 41 and the arc contactor (on the fixed side) 21, the thermal energy is efficiently removed, and the arc is extinguished. As a result, the arc contactor (on the movable side) 41 and the arc contactor (on the fixed side) 21 are electrically disconnected from each other.

In the conventional technique, there are many cases where the insulation nozzle 23 is provided in the movable contactor portion 3, together with the movable conductive contactor 32. However, it is preferable that the weight of movable contactor portion 3 is reduced for the movable contactor portion 3 to be movable. Accordingly, it is preferable that the insulation nozzle 23 is provided in the fixed contactor portion 2 that is not movable. Note that the insulation nozzle 23 may be provided in the movable contactor portion 3.

The insulation nozzle 23 may be provided in either the fixed contactor portion 2 or the movable contactor portion 3, but the movable contactor portion 3 vibrates due to the movement. Accordingly, electrical performance deterioration due to the vibration can be more suppressed in the case where the insulation nozzle 23 is provided in the fixed contactor portion 2 compared with the case where the insulation nozzle 23 is provided in the movable contactor portion 3.

Since the insulation nozzle 23 can suppress the flowing in of the arc-extinguishing gas with low insulation performance and a high temperature into the fixed conductive contactor 22, it is preferable that the insulation nozzle 23 is provided in the fixed contactor portion 2.

The inner wall 52 of the cylinder 42 supports the insulation nozzle 23. When the insulation nozzle 23 is supported by the inner wall 52 of the cylinder 42, the separation distance between the insulation nozzle 23 and the trigger electrode 31 is ensured. It is preferable that a clearance distance between the insulation nozzle 23 and the trigger electrode 31 is larger than the clearance distance between the arc contactor (on the movable side) 41 and the trigger electrode 31 during contact therebetween.

When the insulation nozzle 23 and the trigger electrode 31 contact with each other, a high electric field portion is created and considerable degradation of the electrical performance occurs. With the configuration described above, the maximum positional displacement width of the trigger electrode 31 from the center axis can be restricted by the inner diameter of the arc contactor (on the movable side) 41, preventing contact between the trigger electrode 31 and the insulation nozzle 23. In addition, an amount of leakage of the arc-extinguishing gas from the pressure accumulating passage 38 can be suppressed by limiting the clearance distance between the arc contactor (on the movable side) 41 and the trigger electrode 31.

When spraying the arc-extinguishing gas to the arc generated between the arc contactor (on the movable side) 41 and the arc contactor (on the fixed side) 21, it is preferable that the insulation nozzle 23 has a low internal pressure. Accordingly, it is preferable that the insulation nozzle 23 has a shape such that a cross-sectional area of the arc-extinguishing gas flow passage formed by the arc contactor (on the fixed side) 21 and the insulation nozzle 23 increases toward the open-end direction.

According to the test results, it is preferable that the passage has the following configuration to obtain good breaking performance.

Area of the passage formed between the arc contactor (on the fixed side) 21 and the insulation nozzle 23>Area of the passage in the throat portion 23a of the insulation nozzle 23>Area of an ejecting portion of the arc contactor (on the movable side) 41

The insulation nozzle 23 controls the flow of the arc-extinguishing gas sprayed via the compression chamber 36 and the pressure accumulating passage 38 to efficiently cool the arc. Since the pressure inside the insulation nozzle 23 becomes a downstream pressure when the arc-extinguishing gas is sprayed, it is preferable to provide a structure such that the insulation nozzle 23 is always maintained at a low pressure.

The insulation nozzle 23 not only creates the arc-extinguishing gas flow parallel to the axis from the driving-device direction side to the open-end direction side, but also creates the arc-extinguishing gas flow in a direction crossing the arc. The arc is efficiently cooled by this flow. Since the arc-extinguishing gas which has been sprayed to the arc and become a high temperature has low insulation performance, it is preferable that the arc-extinguishing gas is exhausted without contacting the fixed conductive contactor 22 and the movable conductive contactor 32.

O-ring 53

The O-ring 53 is a member that ensures air-tightness between the insulation nozzle 23 and the inner wall 52 of the cylinder 42. The O-ring 53 is a ring-shaped member made of an insulating rubber material such as ethylene-propylene-diene rubber (EPDM) or nitrile rubber (NBR). It is preferable that the O-ring 53 is formed of a member that retains elasticity over time even at a high temperature.

The O-ring 53 is arranged on the outer circumference of the step 231 on the insulation nozzle 23. The insulation nozzle 23 is supported by the inner wall 52 forming the cylinder 42 via the O-ring 53. The O-ring 53 ensures air-tightness between the insulation nozzle 23 and the inner wall 52 forming the cylinder 42.

Exhaust Cylinder 24

The exhaust cylinder 24 is a cylindrical member made of conductive metal formed by shaving. The arc contactor (on the fixed side) 21 and the fixed conductive contactor 22 are arranged at the end of the exhaust cylinder 24 on the driving-device direction side, so that the axes thereof are aligned with the axis of the exhaust cylinder 24. The exhaust cylinder 24 has the exhaust ports 24a and 24b for exhausting the arc-extinguishing gas that has become a high temperature. The exhaust cylinder 24 may be formed integrally with the arc contactor (on the fixed side) 21 and the fixed conductive contactor 22.

The lead-out conductor 7a is connected to the exhaust cylinder 24 via the sealed container 8. The exhaust cylinder 24 is an arc-extinguishing gas flow passage, and guides the arc-extinguishing gas which has been sprayed to the arc and has become a high temperature from the arc space between the arc contactor (on the fixed side) 21 and the trigger electrode 31 to the sealed container 8.

When the gas circuit breaker 1 becomes the opened state, the arc-extinguishing gas in the compression chamber 36 formed by the piston 33 of the movable contactor portion 3 and the cylinder 42 of the fixed contactor portion 4 is pressurized, and is sprayed to the arc space between the arc contactor (on the fixed side) 21 and the arc contactor (on the movable side) 41. The arc-extinguishing gas that has been sprayed to the arc and become a high temperature is finally exhausted into the sealed container 8 through the exhaust ports 24a and 24b of the exhaust cylinder 24.

Fixed Contactor Portion 4

The fixed contactor portion 4 includes the arc contactor (on the movable side) 41, the cylinder 42, and the support 43. The arc contactor (on the movable side) 41 corresponds to the second arc contactor in the claims. Furthermore, the arc contactor (on the movable side) 41 may be also referred to herein as the second arc contactor.

Arc Contactor (on a Movable Side) 41

The arc contactor (on the movable side) 41 is a cylindrical electrode that is arranged on an end of the fixed contactor portion 4 on the open-end direction side along the center axis of the cylinder of the fixed contactor portion 4. The arc contactor (on the movable side) 41 is formed of a metal conductor which is formed into a cylindrical shape having a diameter substantially equal to that of the fixed conductive contactor 22 and which the end on the open-end direction side has a rounded shape. The arc contactor (on the movable side) 41 is made of metal containing 10% to 40% of copper and 90% to 60% of tungsten, etc.

Figure 4:
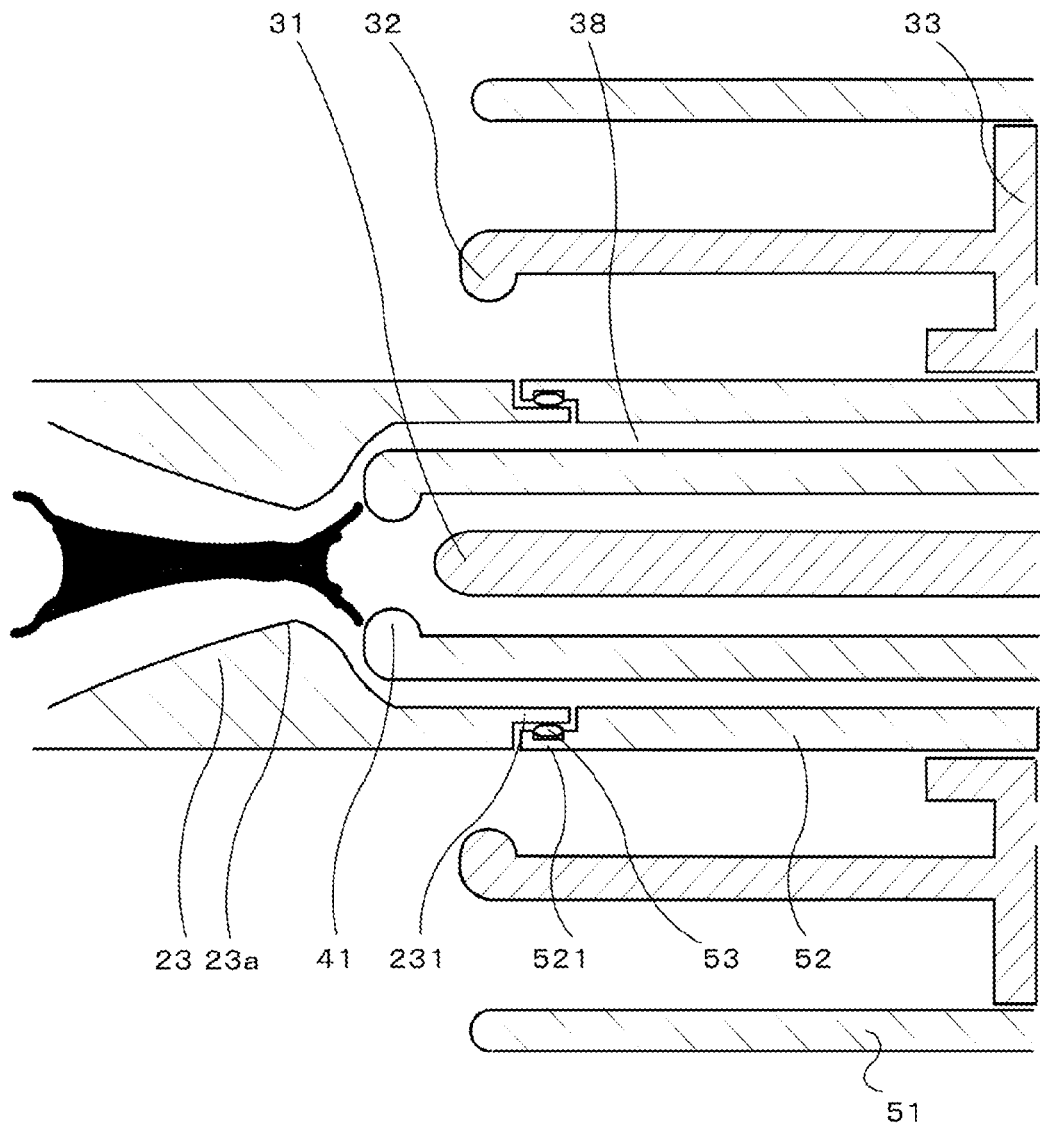
FIG. 4 is an enlarged view illustrating positional relation between an insulation nozzle and an inner wall of a cylinder of the gas circuit breaker according to the first embodiment.

As illustrated in FIG. 4, the outer circumference of the arc contactor (on the movable side) 41 and the inner circumference of the inner wall 52 of the cylinder 42 form the pressure accumulating passage 38 which is a passage for the pressurized arc-extinguishing gas. In an end stage of the pressurization process of the arc-extinguishing gas in the compression chamber 36, the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

The arc contactor (on the movable side) 41 is fixed by an insulation support member via the support 43 forming an outer circumference of the fixed contactor portion 4. The arc contactor (on the movable side) 41 is fixed by the support 43 and does not move. Therefore, the arc contactor (on the movable side) 41 is not included in a weight of a movable component driven by the driving device 9. Accordingly, the heat capacity and the surface area can be increased without increasing a driving force of the driving device 9, and can improve the durability of the arc contactor (on the movable side) 41.

The arc contactor (on the movable side) 41 is arranged to be separated from the arc contactor (on the fixed side) 21 at a distance which the insulation performance can be ensured after the arc is extinguished. Since the arc contactor (on the movable side) 41 and the arc contactor (on the fixed side) 21 are fixed and do not move, the surface area of the arc contactor (on the movable side) 41 can be increased without increasing a driving force of the driving device 9. Accordingly, the electric field distribution between the arc contactor (on the movable side) 41 and the arc contactor (on the fixed side) 21 can be more approximated to uniform electric field, and the distance between the arc contactor (on the movable side) 41 and the arc contactor (on the fixed side) 21 can be made shorter than the conventional technique.

In addition, the flow rate of the arc-extinguishing gas to be sprayed to the arc can be defined based on the distance between the insulation nozzle 23 and the arc contactor (on the fixed side) 21 and the distance between the insulation nozzle 23 and the arc contactor (on the movable side) 41. It is preferable that the distance between the arc contactor (on the fixed side) 21 and the insulation nozzle 23 is larger than the distance between the arc contactor (on the movable side) 41 and the insulation nozzle 23.

The fixed contactor portion 4 and the movable contactor portion 3 are configured to always have the same potential and to be always brought into a conductive state, via a sliding contact, etc. Since the trigger electrode 31 of the movable contactor portion 3 is inserted into the arc contactor (on the fixed side) 21 when the gas circuit breaker 1 is in the closed state, the fixed contactor portion 2 and the fixed contactor portion 4 are electrically connected via the movable contactor portion 3. When the gas circuit breaker 1 is in the closed state, the arc contactor (on the movable side) 41 serves as a conductor forming a part of an electrical circuit so that the lead-out conductors 7a and 7b are electrically connected.

On the other hand, since the trigger electrode 31 of the movable contactor portion 3 is separated from the arc contactor (on the fixed side) 21 of the fixed contactor portion 2 when the gas circuit breaker 1 is in the opened state, the arc contactor (on the movable side) 41 is electrically disconnected from the arc contactor (on the fixed side) 21.

However, when the gas circuit breaker 1 becomes the opened state, the trigger electrode 31 of the movable contactor portion 3 and the arc contactor (on the fixed side) 21 of the fixed contactor portion 2 are mechanically separated from each other, but are in an electrically conductive state by the generated arc. Accordingly, in a state in which the arc is present, the arc contactor (on the movable side) 41 and the arc contactor (on the fixed side) 21 are in an electrically conductive state.

When the gas circuit breaker 1 becomes the opened state, the movable contactor portion 3 is driven by the driving device 9, and moves between the arc contactor (on the fixed side) 21 and the arc contactor (on the movable side) 41 from the open-end direction side to the driving-device direction side. Accordingly, the trigger electrode 31 also moves between the arc contactor (on the fixed side) 21 and the arc contactor (on the movable side) 41 from the open-end direction side to the driving-device direction side.

The fixed conductive contactor 22 and the movable conductive contactor 32 are separated from each other before the trigger electrode 31 is separated from the arc contactor (on the fixed side) 21. This is to produce the arc always at between the trigger electrode 31 and the arc contactor (on the fixed side) 21, not at between the fixed conductive contactor 22 and the movable conductive contactor 32.

The arc is generated between the trigger electrode 31 and the arc contactor (on the fixed side) 21 from a time point when the trigger electrode 31 starts to be separated from the arc contactor (on the fixed side) 21 until a separation distance between the arc contactor (on the fixed side) 21 and the arc contactor (on the movable side) 41 becomes equal to the separation distance between the arc contactor (on the fixed side) 21 and the trigger electrode 31.

When the separation distance between the arc contactor (on the fixed side) 21 and the arc contactor (on the movable side) 41 becomes equal to the separation distance between the arc contactor (on the fixed side) 21 and the trigger electrode 31, the arc is transferred from the trigger electrode 31 to the arc contactor (on the movable side) 41.

The arc is generated between the arc contactor (on the movable side) 41 and the arc contactor (on the fixed side) 21 from a time point when the separation distance between the arc contactor (on the fixed side) 21 and the arc contactor (on the movable side) 41 becomes equal to the separation distance between the arc contactor (on the fixed side) 21 and the trigger electrode 31 until the arc is extinguished. At this time, the arc contactor (on the movable side) 41 and the arc contactor (on the fixed side) 21 form a pair of electrodes arranged to face each other, and bear the arc.

The trigger electrode 31 moves further in the driving-device direction, that is, in a direction in which the separation distance between the arc contactor (on the fixed side) 21 and the trigger electrode 31 becomes larger than the separation distance between the arc contactor (on the fixed side) 21 and the arc contactor (on the movable side) 41. This causes the trigger electrode 31 to be separated from the arc generated between the arc contactor (on the movable side) 41 and the arc contactor (on the fixed side) 21, reducing the degradation of the trigger electrode 31.

The trigger electrode 31 moves further in the driving-device direction. At this time, the arc-extinguishing gas pressurized in the compression chamber 36 is sprayed via the pressure accumulating passage 38 and via the arc contactor (on the movable side) 41 and the insulation nozzle 23, and the arc between the arc contactor (on the fixed side) 21 and the arc contactor (on the movable side) 41 is extinguished.

When the trigger electrode 31 is moved by the driving device 9 in the driving-device direction, the arc is transferred from the trigger electrode 31 to the arc contactor (on the movable side) 41. The arc contactor (on the movable side) 41 and the arc contactor (on the fixed side) 21 are electrically connected to each other by the arc, but the opened state is reached by extinguishing the arc by the arc-extinguishing gas.

In addition, when the gas circuit breaker 1 becomes the opened state, it is preferable to reduce the degradation of the fixed conductive contactor 22 and the movable conductive contactor 32 due to the arc. Although the fixed conductive contactor 22 and the movable conductive contactor 32 are separated from each other, the arc contactor (on the fixed side) 21, the trigger electrode 31, and arc contactor (on the movable side) 41 bear the arc to prevent the arc from being generated between the fixed conductive contactor 22 and the movable conductive contactor 32. Therefore, the trigger electrode 31 and the arc contactor (on the fixed side) 21 contact each other while maintaining a sufficiently high electrical conductivity until the fixed conductive contactor 22 and the movable conductive contactor 32 are separated from each other, maintaining a good conductive state.

When the gas circuit breaker 1 becomes the opened state, the arc-extinguishing gas in the compression chamber 36 formed by the piston 33 of the movable contactor portion 3 and the cylinder 42 of the fixed contactor portion 4 is pressurized.

After the pressurization of the arc-extinguishing gas in the compression chamber 36 has completed or has advanced for a predetermined extent, the arc contactor (on the movable side) 41 and the trigger electrode 31 are separated from each other, and the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

Accordingly, the arc between the arc contactor (on the movable side) 41 and the arc contactor (on the fixed side) 21 is extinguished, and the arc contactor (on the movable side) 41 and the arc contactor (on the fixed side) 21 are electrically disconnected.

Note that a tip of the arc contactor (on the movable side) 41 may be divided in a circumference direction to be a finger-like electrode. In this case, the arc contactor (on the movable side) 41 is flexible, and the inner diameter of an opening edge of the arc contactor (on the movable side) 41 is slightly smaller than the outer diameter of the trigger electrode 31 and is narrowed. When the trigger electrode 31 is inserted into an opening of the arc contactor (on the movable side) 41, the trigger electrode 31 and the arc contactor (on the movable side) 41 contact each other, and are connected.

Cylinder 42

The cylinder 42 is a cylindrical member formed of a metal conductor and has a bottom at one end and an opening at the other end. The cylinder 42 has a cylindrical inner wall 52 inside and forms a torus-shaped space. The cylinder 42 has the outer wall 51 forming an outer circumference portion. The inner wall 52 and the outer wall 51 are configured to form a concentric circle with the arc contactor (on the movable side) 41. The cylinder 42 forms a torus-shaped space partitioned by the outer wall 51 and the inner wall 52.

The outer wall 51 of the cylinder 42 has an inner diameter that is slidable with an outer diameter of the piston 33 of the movable contactor portion 3. Furthermore, the inner wall 52 of the cylinder 42 has the outer diameter that is slidable with a hole diameter of the torus-shaped of the piston 33.

The inner wall 52 of the cylinder 42 has the step 521 on the inner circumference of the end on the open-end direction side, so that the step 521 is fitted into the step 231 provided on the outer circumference of the end of the insulation nozzle 23 on the driving-device direction side. The insulation nozzle 23 is supported by the inner wall 52 forming the cylinder 42 by fitting the step 521 on the inner wall 52 of the cylinder 42 into the step 231 on the insulation nozzle 23.

The step 231 corresponds to a first step in the claims, and the step 521 corresponds to a second step in the claims. In addition, the step 521 on the inner wall 52 of the cylinder 42 supports the step 231 on the insulation nozzle 23 via the O-ring 53. The O-ring 53 ensures air-tightness between the insulation nozzle 23 and the inner wall 52 forming the cylinder 42.

It is preferable that the joining portion between the insulation nozzle 23 and the inner wall 52 and the inner wall 52 of the cylinder 42 are formed thin to reduce the pressure decrease of the arc-extinguishing gas compressed to be sprayed to the arc. It is preferable that the joining portion between the insulation nozzle 23 and the inner wall 52 and the inner wall 52 of the cylinder 42 are formed to have a thickness of about 15 mm or less.

If the joining portion between the insulation nozzle 23 and the inner wall 52 and the inner wall 52 of the cylinder 42 are formed thick, the deformation of the insulation nozzle 23 due to the high-pressure arc-extinguishing gas that has reached a high temperature is reduced. However, the pressure of the arc-extinguishing gas pressurized in the compression chamber 36 decreases when the arc-extinguishing gas flows into the pressure accumulating passage 38.

With a structure in which the outer circumference of the step 231 on the insulation nozzle 23 is fitted into the inner circumference of the step 521 on the inner wall 52 of the cylinder 42 so that the insulation nozzle 23 is supported by the inner wall 52 of the cylinder 42, the joining portion between the insulation nozzle 23 and the inner wall 52 and the inner wall 52 of the cylinder 42 can be formed thin. This ensures the pressure of the arc-extinguishing gas when flowing into the pressure accumulating passage 38 from the compression chamber 36.

The insulation nozzle 23 is supported by and joined to the inner wall 52 forming the cylinder 42 at a position separated from the generated arc in the driving-device direction with respect to the movable conductive contactor 32. The insulation nozzle 23 is supported by and joined to the inner wall 52 forming the cylinder 42 at a position separated from the generated arc in the driving-device direction with respect to an electrostatic shield 61.

The cylinder 42 is arranged in the fixed contactor portion 4 so that the bottom is placed on the driving-device direction side and the opening is placed on the open-end direction side. The cylinder 42 is arranged in the arc-extinguishing gas. The bottom of the cylinder 42 has an insertion hole 42a into which the piston support 33a for supporting the piston 33 of the movable contactor portion 3 is inserted.

The piston 33 is inserted into the cylinder 42, and the compression chamber 36 for pressurizing the arc-extinguishing gas is formed by the cylinder 42 and the piston 33. When the gas circuit breaker 1 becomes the opened state, the cylinder 42 and the piston 33 compress the arc-extinguishing gas in the compression chamber 36. The cylinder 42 and the piston 33 ensure air-tightness of the compression chamber 36. In this way, the arc-extinguishing gas in the compression chamber 36 is pressurized.

A through hole 42b is provided in the inner wall 52 of the cylinder 42. The through hole 42b connects the compression chamber 36 and the pressure accumulating passage 38. The arc-extinguishing gas pressurized in the compression chamber 36 is guided to the arc space via the pressure accumulating passage 38 and the insulation nozzle 23 when the sealing of the arc contactor (on the movable side) 41 is released by the trigger electrode 31.

A check valve 42e may be provided in the through hole 42b in the cylinder 42 communicating the inside of the compression chamber 36 and the pressure accumulating passage 38 to prevent the arc-extinguishing gas from flowing into the compression chamber 36 from the pressure accumulating passage 38 when the pressure in the compression chamber 36 is lower than that in the pressure accumulating passage 38.

When the gas circuit breaker 1 becomes the opened state, the cylinder 42 compresses the arc-extinguishing gas in the compression chamber 36 in cooperation with the piston 33.

After the pressurization of the arc-extinguishing gas in the compression chamber 36 has completed or has advanced for a predetermined extent, the arc contactor (on the movable side) 41 and the trigger electrode 31 are separated from each other, and the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

In this way, the arc between the arc contactor (on the movable side) 41 and the arc contactor (on the fixed side) 21 is extinguished, whereby the arc contactor (on the movable side) 41 and the arc contactor (on the fixed side) 21 are electrically disconnected from each other.

The cylinder 42 compresses the arc-extinguishing gas in the compression chamber 36 in cooperation with the piston 33. Accordingly, the cylinder 42 and the piston 33 are in the sealed state when the arc-extinguishing gas is compressed, preventing a pressure leak. However, when an excessive pressure is continuously applied to the piston 33 by the compressed arc-extinguishing gas, this may lead to the reverse movement of the piston 33, the trigger electrode 31, and the movable conductive contactor 32. A hole including a pressure valve may be provided in the bottom of the cylinder 42 to prevent this reverse movement, so that the pressure is released by appropriately opening and closing the pressure valve. Alternatively, by arranging the check valve 42e, the reverse movement of the piston 33, the trigger electrode 31, and the movable conductive contactor 32 can be suppressed.

The cylinder 42 has an intake hole 42c in the bottom, and an air intake valve 42d arranged in the intake hole 42c. When the gas circuit breaker 1 becomes the closed state again, the movable contactor portion 3 is moved by the driving device 9 from the driving-device direction to the open-end direction side. Accordingly, the piston 33 also moves from the driving-device direction to the open-end direction. At this time, the compression chamber 36 formed by the piston 33 and the cylinder 42 is expanded, and the pressure in the compression chamber 36 decreases. When the pressure in the compression chamber 36 decreases, the arc-extinguishing gas in the sealed container 8 is sucked into the compression chamber 36 via the intake hole 42c and the air intake valve 42d. Since the sucked arc-extinguishing gas is sufficiently distant from the arc space that became a high temperature, the arc-extinguishing gas having a low temperature is filled in the compression chamber 36.

Support 43

The support 43 is a cylindrical conductor having a bottom in one end surface, and the bottom end surface is arranged on the driving-device direction side. The lead-out conductor 7b is connected to the support 43 via the sealed container 8. The support 43 is fixed to the sealed container 8 by an insulation member. The support 43 supports the arc contactor (on the movable side) 41 and the cylinder 42.

Movable Contactor Portion 3

The movable contactor portion 3 includes the trigger electrode 31, the movable conductive contactor 32, the piston 33, and the insulation rod 37. In the conventional technique, the movable contactor includes a nozzle, a cylinder, and an arc electrode, resulting in large size. However, the present embodiment can achieve significant weight reduction. It is not necessary that the trigger electrode 31 and the piston 33 are integrated and simultaneously operated, but when the trigger electrode 31 and the piston 33 are integrated, it is possible to simplify the structure. Note that in some cases, it is advantageous in terms of breaking performance to have a structure that the trigger electrode 31 is moved more rapidly than the piston 33.

Movable Conductive Contactor 32

The movable conductive contactor 32 is a cylindrical electrode arranged on an end of the movable contactor portion 3 on the open-end direction side along the center axis of the cylinder of the movable contactor portion 3. The movable conductive contactor 32 is formed of a cylindrical metal conductor that is formed to have a rounded shape at the end on the open-end direction side. The metal forming the movable conductive contactor 32 is preferably aluminum having high electric conductivity and light weight, but may also be copper. It is preferable that the movable conductive contactor 32 is reduced in weight to be movable.

The movable conductive contactor 32 has an outer diameter that contacts and is slidable with an inner diameter of the fixed conductive contactor 22 of the fixed contactor portion 2. The movable conductive contactor 32 is arranged on a surface of the piston 33 on the open-end direction side.

When the gas circuit breaker 1 is in the closed state, the movable conductive contactor 32 is inserted into the fixed conductive contactor 22 of the fixed contactor portion 2. Accordingly, the movable conductive contactor 32 contacts with the fixed conductive contactor 22, and the movable contactor portion 3 and the fixed contactor portion 2 are electrically connected to each other. The movable conductive contactor 32 has the capability of applying a rated current when being conducted.

On the other hand, when the gas circuit breaker 1 is in the opened state, the movable conductive contactor is physically separated from the fixed conductive contactor 22 of the fixed contactor portion 2, and the movable contactor portion 3 and the fixed contactor portion 2 are electrically disconnected from each other.

The movable conductive contactor 32 is formed integrally with the piston 33 formed by the conductor. When the gas circuit breaker 1 is in the closed state and in the opened state, the piston 33 is inserted into and contacts the cylinder 42 of the fixed contactor portion 4, and the movable contactor portion 3 and the fixed contactor portion 4 are electrically connected to each other. Since the piston 33 slides in the cylinder 42 of the fixed contactor portion 4, the movable contactor portion 3 and the fixed contactor portion 4 are electrically connected to each other regardless of whether the gas circuit breaker 1 is in the closed state or in the opened state.

Trigger Electrode 31

The trigger electrode 31 is a bar-shaped electrode that is arranged on an end of the movable contactor portion 3 on the open-end direction side along the center axis of the cylinder of the movable contactor portion 3. The trigger electrode 31 is formed of a metal conductor formed into a solid columnar shape which one end is rounded by shaving, etc. At least tip of the trigger electrode 31 is made of metal containing 10% to 40% of copper and 90% to 60% of tungsten, etc.

The trigger electrode 31 has an outer diameter that contacts and is slidable with an inner diameter of the arc contactor (on the fixed side) 21 of the fixed contactor portion 2. The trigger electrode 31 is arranged on the inner side of the arc contactor (on the movable side) 41.

The trigger electrode 31 is arranged inside the arc contactor (on the movable side) 41 so that it is advantageous in terms of the durability in view of the heat capacity, and in terms of the weight and the surface area.

Note that the trigger electrode 31 is connected to the insulation rod 37, together with the piston 33, and this insulation rod 37 is driven by the driving device 9 and the trigger electrode 31 reciprocates between the fixed contactor portion 2 and the fixed contactor portion 4. The trigger electrode 31 is movable relative to the arc contactor (on the fixed side) 21. The trigger electrode 31 is arranged in the arc-extinguishing gas, and bears the arc discharge generated in the arc-extinguishing gas.

When the gas circuit breaker 1 becomes the opened state, it is required to break the current quickly. To operate the movable contactor portion 3 at high speed, it is preferable that the trigger electrode 31 is also reduced in weight. However, when the trigger electrode 31 is reduced in weight, the durability of the trigger electrode 31 against the arc becomes insufficient.

However, the period of time required for the trigger electrode 31 to bear the arc is about 5 to 10 ms in the initial stage in which the trigger electrode 31 starts to move. In the latter of the period of time during which the trigger electrode 31 moves, the heat stress received by the trigger electrode 31 acceleratedly increases, but the arc is transferred to the arc contactor (on the movable side) 41. Accordingly, the durability of the trigger electrode 31 against the arc is not affected by the weight reduction of the trigger electrode 31.

It is preferable that the durability of the arc contactor (on the fixed side) 21, the durability of the arc contactor (on the movable side) 41, and the durability of the trigger electrode 31 have the following relation.

The durability of the arc contactor (on the fixed side) 21≥the durability of the arc contactor (on the movable side) 41≥the durability of the trigger electrode 31

This is because the arc contactor (on the fixed side) 21 is more likely to wear compared to the arc contactor (on the movable side) 41 for the arc-extinguishing gas flow that has become a high temperature is accelerated and thereafter collides with the arc contactor 21. In addition, this is because it is preferable that the trigger electrode 31 that is a movable component is made more lightweight than each of the arc contactor (on the fixed side) 21 and the arc contactor (on the movable side) 41, and a wear level of the trigger electrode 31 is small compared to that on the arc contactor (on the fixed side) 21 and that on the arc contactor (on the movable side) 41 for the high-temperature arc is ignited only for a certain period of time until the arc is commutated to the arc contactor (on the movable side) 41.

The trigger electrode 31 can be reduced in weight by reducing the durability. When the trigger electrode 31 is reduced in weight, the gas circuit breaker 1 can become the closed state more quickly using the driving device 9 having the same driving force, improving the breaking performance. In addition, when the trigger electrode 31 is driven at the same speed, the driving force of the driving device 9 can be reduced, resulting in reduction in weight and size of the driving device 9.

On the other hand, since the arc contactor (on the movable side) 41 is an unmovable and fixed component, the disadvantage of the weight of the arc contactor (on the movable side) 41 being large is small, and the arc contactor (on the movable side) 41 can be increased in thickness. As a result, the arc contactor (on the movable side) 41 can have higher durability than the trigger electrode 31.

When the gas circuit breaker 1 is in the closed state, the trigger electrode 31 is inserted into the arc contactor (on the fixed side) 21 of the fixed contactor portion 2. Accordingly, the trigger electrode 31 contacts with the arc contactor (on the fixed side) 21 of the fixed contactor portion 2 and with the arc contactor (on the movable side) 41 of the fixed contactor portion 4, and the fixed contactor portion 2, the movable contactor portion 3, and the fixed contactor portion 4 are electrically connected. When the gas circuit breaker 1 is in the closed state, the trigger electrode 31 serves as a conductor forming a part of a current circuit so that the lead-out conductors 7a and 7b are electrically connected to each other.

On the other hand, when the gas circuit breaker 1 becomes the opened state, the trigger electrode 31 is separated from the arc contactor (on the fixed side) 21 of the fixed contactor portion 2. Accordingly, the trigger electrode 31 bears the arc generated between the movable contactor portion 3 and the fixed contactor portion 2. The movable conductive contactor 32 and the fixed conductive contactor 22 of the fixed contactor portion 2 are separated from each other before the arc contactor (on the fixed side) 21 and the trigger electrode 31 are separated from each other and after the current is commutated to the arc contactor (on the fixed side) 21 side and the trigger electrode 31 side, and the arc is not generated between the movable conductive contactor 32 and the fixed conductive contactor 22. The trigger electrode 31 forms a pair of electrodes arranged to face the arc contactor (on the fixed side) 21, and serves as one of electrodes that contact the arc when the gas circuit breaker 1 becomes the opened state.

The arc generated when the gas circuit breaker 1 is in the opened state concentrates between the trigger electrode 31 and the arc contactor (on the fixed side) 21. The arc can be prevented from being generated between the movable conductive contactor 32 and the fixed conductive contactor 22, reducing the degradation of the movable conductive contactor 32 and the fixed conductive contactor 22.

When the gas circuit breaker 1 becomes the opened state, the movable contactor portion 3 is driven by the driving device 9, and moves between the arc contactor (on the fixed side) 21 and the arc contactor (on the movable side) 41 from the open-end direction side to the driving-device direction side. Accordingly, the trigger electrode 31 also moves between the arc contactor (on the fixed side) 21 and the arc contactor (on the movable side) 41 from the open-end direction side to the driving-device direction side. The fixed conductive contactor 22 and the movable conductive contactor 32 are separated from each other before the trigger electrode 31 is separated from the arc contactor (on the fixed side) 21. This is not to cause the arc to be generated between the fixed conductive contactor 22 and the movable conductive contactor 32.

The arc is generated between the trigger electrode 31 and the arc contactor (on the fixed side) 21 from a time point when the trigger electrode 31 starts to be separated from the arc contactor (on the fixed side) 21 until the separation distance between the arc contactor (on the fixed side) 21 and the arc contactor (on the movable side) 41 becomes equal to the separation distance between the arc contactor (on the fixed side) 21 and the trigger electrode 31.

When the separation distance between the arc contactor (on the fixed side) 21 and the arc contactor (on the movable side) 41 becomes equal to the separation distance between the arc contactor (on the fixed side) 21 and the trigger electrode 31, the arc is transferred from the trigger electrode 31 to the arc contactor (on the movable side) 41. The arc is generated between the arc contactor (on the movable side) 41 and the arc contactor (on the fixed side) 21 from a time point when the separation distance between the arc contactor (on the fixed side) 21 and the arc contactor (on the movable side) 41 becomes equal to the separation distance between the arc contactor (on the fixed side) 21 and the trigger electrode 31 until the arc is extinguished. At this time, the arc contactor (on the movable side) 41 and the arc contactor (on the fixed side) 21 form a pair of electrodes that are arranged to face each other, and bear the arc.

The trigger electrode 31 moves further in the driving-device direction, that is, in a direction in which the separation distance between the arc contactor (on the fixed side) 21 and the trigger electrode 31 becomes larger than the separation distance between the arc contactor (on the fixed side) 21 and the arc contactor (on the movable side) 41. This causes the trigger electrode 31 to be separated from the arc generated between the arc contactor (on the movable side) 41 and the arc contactor (on the fixed side) 21, reducing the degradation of the trigger electrode 31.

The trigger electrode 31 moves further in the driving-device direction. At this time, the arc-extinguishing gas pressurized in the compression chamber 36 that is formed by the piston 33 and the cylinder 42 is sprayed via the pressure accumulating passage 38 and the insulation nozzle 23, and the arc between the arc contactor (on the fixed side) 21 and the arc contactor (on the movable side) 41 is extinguished.

When the gas circuit breaker 1 becomes the opened state, the cylinder 42 compresses the arc-extinguishing gas in the compression chamber 36 in cooperation with the piston 33. As a result, the arc-extinguishing gas in the compression chamber 36 is pressurized.

After the pressurization of the arc-extinguishing gas in the compression chamber 36 has completed or has advanced for a predetermined extent, the arc contactor (on the movable side) 41 and the trigger electrode 31 are separated from each other, and the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

In this way, the arc between the arc contactor (on the movable side) 41 and the arc contactor (on the fixed side) 21 is extinguished, and the arc contactor (on the movable side) 41 and the arc contactor (on the fixed side) 21 are electrically disconnected from each other. After the arc is extinguished, the arc current does not flow in the trigger electrode 31.

The movement of the trigger electrode 31 relative to the arc contactor (on the fixed side) 21 and the arc contactor (on the movable side) 41 is caused by the insulation rod 37 that is fixed to and supported by the trigger electrode 31 and the piston 33. The insulation rod 37 is driven by the driving device 9. The insulation rod 37 is made of an insulating material. The insulation rod 37 is arranged on the center axes of the trigger electrode 31, the arc contactor (on the fixed side) 21, and the arc contactor (on the movable side) 41.

Piston 33

The piston 33 is a torus-shaped plate arranged on an end surface of the movable contactor portion 3 on the open-end direction side of the movable contactor. The piston includes the movable conductive contactor 32 on a surface on the open-end direction side. The piston 33 is formed of a metal conductor formed into a torus-shaped plate by shaving, etc.

The piston 33 has an outer diameter that is slidable with an inner diameter of the outer wall 51 of the cylinder 42 of the fixed contactor portion 4. The piston 33 has a hole diameter of the torus-shaped that is slidable with the inner wall 52 of the cylinder 42 of the fixed contactor portion 4.

The piston 33 includes a plurality of piston supports 33a connected to the surface on the driving-device direction side. The piston support 33a is a member that is formed by a metal conductor formed into a rod shape. The piston supports 33a fix the piston 33 to the trigger electrode 31 via the insertion hole 42a of the cylinder 42. The piston 33 is connected to the insulation rod 37 via the piston supports 33a and the trigger electrode 31.

The piston 33 is slidably inserted into and arranged in the cylinder 42 of the fixed contactor portion 4. The compression chamber 36 for pressurizing the arc-extinguishing gas is formed by the piston 33 and the cylinder 42. The piston 33 is arranged in the arc-extinguishing gas.

The piston 33 reciprocates via the insulation rod 37 by the driving device 9. The reciprocation by the driving device 9 is performed when the gas circuit breaker 1 becomes the closed state and becomes the opened state.

When the gas circuit breaker 1 becomes the opened state, the piston 33 compresses the arc-extinguishing gas in the compression chamber 36 in cooperation with the cylinder 42. As a result, the arc-extinguishing gas in the compression chamber 36 is pressurized.

The pressure accumulating passage 38 communicates with the compression chamber 36 through the through hole 42b provided in the cylinder 42. In the stage in which the arc-extinguishing gas in the compression chamber 36 is pressurized by the piston 33 and the cylinder 42, the pressure leak of the pressure accumulating passage 38 is prevented. Accordingly, the arc-extinguishing gas pressurized to the same pressure is filled in the compression chamber 36 and the pressure accumulating passage 38.

The check valve 42e may be provided in the through hole 42b in the cylinder 42 communicating the inside of the compression chamber 36 and the pressure accumulating passage 38, to prevent the arc-extinguishing gas from flowing into the compression chamber 36 from the pressure accumulating passage 38 when the pressure in the compression chamber 36 is lower than that in the pressure accumulating passage 38.

This can suppress the pressure in the pressure accumulating passage 38 which supplies the arc-extinguishing gas to the arc space between the arc contactor (on the movable side) 41 and the arc contactor (on the fixed side) 21 from being greatly decreased by the pressure in the compression chamber 36 when the gas circuit breaker 1 is in the opened state, even when the movable contactor portion 3 reversely moves in the open-end direction.

In addition, in the stage in which the arc-extinguishing gas in the compression chamber 36 is pressurized, the compression chamber 36 formed by the piston 33 and the cylinder 42 and the pressure accumulating passage 38 are maintained in the sealed state, and are separated from the arc. Since the arc-extinguishing gas is less affected by the heat of the arc, the pressurized arc-extinguishing gas in the compression chamber 36 and the pressure accumulating passage 38 has a low temperature. The arc-extinguishing gas having a low temperature is sprayed to the arc between the arc contactor (on the movable side) 41 and the arc contactor (on the fixed side) 21, and the arc is efficiently extinguished.

The piston 33 receives the pressure of the arc generated between the trigger electrode 31 or the arc contactor (on the movable side) 41 and the arc contactor (on the fixed side) 21 and the pressure of the arc-extinguishing gas that is heated to a high temperature by the arc, and these pressures act as a force to move the entire movable contactor portion 3 toward the driving-device direction. This can reduce the output of the driving device 9, resulting in reduction in size of the driving device 9.

After the pressurization of the arc-extinguishing gas in the compression chamber 36 has completed or has advanced for a predetermined extent, the arc contactor (on the movable side) 41 and the trigger electrode 31 are separated from each other, and the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

In this way, the arc between the arc contactor (on the movable side) 41 and the arc contactor (on the fixed side) 21 is extinguished, whereby the arc contactor (on the movable side) 41 and the arc contactor (on the fixed side) 21 are electrically disconnected from each other.

The heat by the arc generated between the arc contactor (on the fixed side) 21 and the trigger electrode 31 or between the arc contactor (on the fixed side) 21 and the arc contactor (on the movable side) 41, and the arc-extinguishing gas that is heated to a high temperature by the arc pass through the exhaust ports 24a and 24b at the same time as the generation of the arc, and are exhausted into the sealed container 8 quickly.

Insulation Rod 37

The insulation rod 37 is a bar-shaped member made of the insulating material. The trigger electrode 31 and the piston 33 are fixed to the open-end direction side of the insulation rod 37. The driving-device direction side of the insulation rod 37 is connected to the driving device 9.

The insulation rod 37 is arranged on the center axes of the trigger electrode 31, the arc contactor (on the fixed side) 21, and the arc contactor (on the movable side) 41. The trigger electrode 31 stands on the end portion of the insulation rod 37 on the open-end direction side.

The insulation rod 37 reciprocates the trigger electrode 31 and the piston 33 while maintaining the electric insulation performance between the driving device 9 and the sealed container 8. The reciprocation of the insulation rod 37 is performed by the driving device 9. The reciprocation by the driving device 9 is performed when the gas circuit breaker 1 becomes the closed state and becomes the opened state.

1-3. Action

Next, the action of the gas circuit breaker 1 of the present embodiment will be described based on FIGS. 1 to 4.

A. A Case Where the Gas Circuit Breaker 1 is in the Closed State

Firstly, a case where the gas circuit breaker 1 of the present embodiment is in the closed state will be described. When in the closed state, the gas circuit breaker 1 conducts the current flowing in the lead-out conductors 7a and 7b.

In the case where the gas circuit breaker 1 of the present embodiment is in the closed state, the fixed contactor portion 2 and the fixed contactor portion 4 are electrically connected to each other via the movable contactor portion 3, and the current flows between the lead-out conductors 7a and 7b. Specifically, the movable conductive contactor 32 of the movable contactor portion 3 is inserted into the fixed conductive contactor 22 of the fixed contactor portion 2. In this way, the fixed conductive contactor 22 contacts with the movable conductive contactor 32, and the fixed contactor portion 2 and the movable contactor portion 3 are brought into an electrically conductive state.

In addition, the trigger electrode 31 of the movable contactor portion 3 is inserted into the arc contactor (on the fixed side) 21 of the fixed contactor portion 2. In this way, the arc contactor (on the fixed side) 21 contacts the trigger electrode 31, and the fixed contactor portion 2 and the movable contactor portion 3 are brought into an electrically conductive state.

Furthermore, the piston 33 of the movable contactor portion 3 is inserted into the cylinder 42 of the fixed contactor portion 4. The piston 33 and the movable conductive contactor 32 are formed integrally with each other and are electrically connected to each other. This enables the movable conductive contactor 32 to be electrically connected to the cylinder 42, and the fixed contactor portion 4 and the movable contactor portion 3 are brought into an electrically conductive state.

As a result, the fixed contactor portion 2 and the fixed contactor portion 4 are electrically connected to each other via the movable contactor portion 3, and the lead-out conductors 7a and 7b are brought into an electrically conductive state.

In this state, the arc is not generated in the space between the trigger electrode 31 or the arc contactor (on the movable side) 41 and the arc contactor (on the fixed side) 21. In addition, the pressure of the arc-extinguishing gas is uniformly applied to each portion in the sealed container 8. Accordingly, the arc-extinguishing gas in the compression chamber 36 formed by the piston 33 of the movable contactor portion 3 and the cylinder 42 of the fixed contactor portion 4 is not pressurized. In addition, the arc-extinguishing gas in the pressure accumulating passage 38 is also not pressurized.

When the gas circuit breaker 1 is in the closed state, the pressure of the arc-extinguishing gas in the sealed container 8 is uniform. Accordingly, the gas flow caused by the arc-extinguishing gas is not generated.

B. A Case Where the Gas Circuit Breaker 1 Becomes the Opened State

Next, a case where the gas circuit breaker 1 of the present embodiment becomes the opened state will be described. The gas circuit breaker 1 is in the opened state, and the current flowing between the lead-out conductors 7a and 7b is broken.

The breaking operation for opening the gas circuit breaker 1 into the opened state is performed in the case where the gas circuit breaker 1 is switched from the conductive state to the breaking state to break a fault current or a load current or to switch a power transmission circuit.

When the gas circuit breaker 1 is switched from the closed state to the opened state, the driving device 9 is driven. The movable contactor portion 3 is moved by the driving device 9 along the axis in the fixed contactor portion 4 in the driving-device direction. In this way, the movable conductive contactor 32 is separated from the fixed conductive contactor 22 and the trigger electrode 31 is separated from the arc contactor (on the fixed side) 21.

When the gas circuit breaker 1 becomes the opened state, the movable contactor portion 3 is driven by the driving device 9, and moves between the fixed contactor portion 2 and the fixed contactor portion 4 from the open-end direction side to the driving-device direction side.

Accordingly, the movable conductive contactor 32 is separated from the fixed conductive contactor 22, and moves from the open-end direction side to the driving-device direction side.

Furthermore, the trigger electrode 31 also moves between the arc contactor (on the fixed side) 21 and the arc contactor (on the movable side) 41 from the open-end direction side to the driving-device direction side. The fixed conductive contactor 22 and the movable conductive contactor 32 are separated from each other before the trigger electrode 31 is separated from the arc contactor (on the fixed side) 21. In this way, the current to be broken is commutated to the trigger electrode 31 and the arc contactor (on the fixed side) 21 side, so that the arc is not generated between the fixed conductive contactor 22 and the movable conductive contactor 32.

The arc is generated between the trigger electrode 31 and the arc contactor (on the fixed side) 21 from a time point when the trigger electrode 31 starts to be separated from the arc contactor (on the fixed side) 21 until the separation distance between the arc contactor (on the fixed side) 21 and the arc contactor (on the movable side) 41 becomes equal to the separation distance between the arc contactor (on the fixed side) 21 and the trigger electrode 31.

When the separation distance between the arc contactor (on the fixed side) 21 and the arc contactor (on the movable side) 41 becomes equal to the separation distance between the arc contactor (on the fixed side) 21 and the trigger electrode 31, the arc is transferred from the trigger electrode 31 to the arc contactor (on the movable side) 41. The arc is generated between the arc contactor (on the movable side) 41 and the arc contactor (on the fixed side) 21 from a time point when the separation distance between the arc contactor (on the fixed side) 21 and the arc contactor (on the movable side) 41 becomes equal to the separation distance between the arc contactor (on the fixed side) 21 and the trigger electrode 31 until the arc is extinguished. At this time, the arc contactor (on the movable side) 41 and the arc contactor (on the fixed side) 21 form a pair of electrodes that are arranged to face each other, and bear the arc.

The trigger electrode 31 moves further in the driving-device direction, that is, in a direction in which the separation distance between the arc contactor (on the fixed side) 21 and the trigger electrode 31 becomes larger than the separation distance between the arc contactor (on the fixed side) 21 and the arc contactor (on the movable side) 41. This causes the trigger electrode 31 to be separated from the arc generated between the arc contactor (on the movable side) 41 and the arc contactor (on the fixed side) 21, reducing the degradation of the trigger electrode 31.

Since the movable contactor portion 3 is driven by the driving device 9 when the gas circuit breaker 1 of the present embodiment becomes the opened state, the piston 33 also moves from the open-end direction side to the driving-device direction side. The piston 33 compresses the arc-extinguishing gas in the compression chamber 36 in cooperation with the cylinder 42. As a result, the arc-extinguishing gas in the compression chamber 36 is pressurized.

The trigger electrode 31 is driven by the driving device 9, and moves further in the driving-device direction. After the pressurization of the arc-extinguishing gas in the compression chamber 36 has completed or has advanced for a predetermined extent, the arc contactor (on the movable side) 41 and the trigger electrode 31 are separated from each other, and the arc-extinguishing gas in the compression chamber 36 which is pressurized by the piston 33 and the cylinder 42 is sprayed to the arc space between the arc contactor (on the fixed side) 21 and the arc contactor (on the movable side) 41 via the pressure accumulating passage 38.

In this way, the arc between the arc contactor (on the movable side) 41 and the arc contactor (on the fixed side) 21 is extinguished, and the arc contactor (on the movable side) 41 and the arc contactor (on the fixed side) 21 are electrically disconnected from each other.

The inner wall 52 of the cylinder 42 has the step 521 on the inner circumference of the end on the open-end direction side, so that the step 521 is fitted into the step 231 provided on the outer circumference of the end of the insulation nozzle 23 on the driving-device direction side. The insulation nozzle 23 is supported by the inner wall 52 forming the cylinder 42 by fitting the step 521 on the inner wall 52 of the cylinder 42 into the step 231 on the insulation nozzle 23.

The arc-extinguishing gas to be sprayed to the arc space between the arc contactor (on the fixed side) 21 and the arc contactor (on the movable side) 41 is pressurized by the piston 33 and the cylinder 42. In addition, the arc space between the arc contactor (on the fixed side) 21 and the arc contactor (on the movable side) 41 has reached a high temperature. The insulation nozzle 23 guides, to the arc space, the high-temperature arc-extinguishing gas that has been highly pressurized, at a high flow velocity.

Therefore, the insulation nozzle 23 may be deformed. The high-temperature arc-extinguishing gas that has been highly pressurized may cause the inner diameter of the insulation nozzle 23 to be expanded. If the inner diameter of the insulation nozzle 23 is expanded, the arc-extinguishing gas cannot be guided to the arc space at a high velocity, which may make it impossible to break the current surely.

The gas circuit breaker pressurizes the arc-extinguishing gas, and sprays the pressurized arc-extinguishing gas to the arc to extinguish the arc. Accordingly, it is not preferable that when the arc-extinguishing gas is sprayed to the arc, the pressure of the pressurized arc-extinguishing gas decreases and the spraying velocity of the arc-extinguishing gas is reduced. This is because the pressure decrease of the pressurized arc-extinguishing gas causes reduction in the flow velocity of the arc-extinguishing gas, which is unlikely to extinguish the arc surely.

However, in the gas circuit breaker 1 according to the present embodiment, the step 521 on the inner wall 52 of the cylinder 42 is fitted into the step 231 on the insulation nozzle 23, so that the insulation nozzle 23 is supported by the inner wall 52 forming the cylinder 42. This reduces the deformation of the insulation nozzle, whereby the breaking performance and electric insulation performance of the gas circuit breaker 1 is more surely maintained.

In addition, the step 521 on the inner wall 52 of the cylinder 42 supports the step 231 on the insulation nozzle 23 via the O-ring 53. The O-ring 53 ensures air-tightness between the insulation nozzle 23 and the inner wall 52 forming the cylinder 42.

This reduces leakage of the arc-extinguishing gas compressed to be sprayed to an arc, whereby the breaking performance and electric insulation performance of the gas circuit breaker 1 is more surely maintained.

The insulation nozzle 23 is supported by and joined to the inner wall 52 forming the cylinder 42 at a position separated from the generated arc in the driving-device direction with respect to the movable conductive contactor 32. This mitigates the fact that the joining portion between the insulation nozzle 23 and the inner wall 52 forming the cylinder 42 contacts the arc and is deformed, whereby the breaking performance and electric insulation performance of the gas circuit breaker 1 is more surely maintained.

The insulation nozzle 23 is supported by and joined to the inner wall 52 forming the cylinder 42 at a position separated from the generated arc in the driving-device direction with respect to the electrostatic shield 61. Hereby, the joining portion between the insulation nozzle 23 and the inner wall 52 forming the cylinder 42 is separated from a portion which is a high potential gradient. As a result, this reduces the likelihood that the dielectric breakdown due to high potential gradient occurs at the joining portion between the insulation nozzle 23 and the inner wall 52 of the cylinder 42, whereby the breaking performance and electric insulation performance of the gas circuit breaker 1 is more surely maintained.

The insulation nozzle 23 guides the arc-extinguishing gas that has flowed through the pressure accumulating passage 38 and has been sprayed from a spraying port portion, to the arc space between the arc contactor (on the fixed side) 21 and the arc contact (on the movable side) 41.

The throat portion 23a of the insulation nozzle 23 pressurizes the arc-extinguishing gas to increase the flow velocity of the arc-extinguishing gas to be sprayed to the arc in an enlarged flow passage on the downstream side of the throat portion 23a. The throat portion 23a of the insulation nozzle 23 concentrates the pressurized arc-extinguishing gas in the arc space. In addition, the insulation nozzle 23 defines the exhaust passage of the arc-extinguishing gas that is heated to a high temperature by the arc.

Furthermore, the insulation nozzle 23 suppresses expansion of the arc using the throat portion 23a, and defines the maximum diameter of the arc. The insulation nozzle 23 controls the flow rate of the arc-extinguishing gas using the throat portion 23a. This enables the arc-extinguishing gas to be efficiently sprayed to the arc generated between the arc contactor (on the movable side) 41 and the arc contactor (on the fixed side) 21, so that the arc is extinguished. As a result, the arc contactor (on the movable side) 41 and the arc contactor (on the fixed side) 21 are electrically disconnected from each other.

The insulation nozzle 23 is arranged to surround the trigger electrode 31, which makes it possible to mitigate reduction in the spraying velocity of the arc-extinguishing gas due to the pressure decrease of the arc-extinguishing gas when sprayed to the arc.

The gas circuit breaker 1 pressurizes the arc-extinguishing gas, and sprays the pressurized arc-extinguishing gas to the arc to extinguish the arc. Accordingly, it is not preferable that when the arc-extinguishing gas is sprayed to the arc, the pressure of the pressurized arc-extinguishing gas decreases and the spraying velocity of the arc-extinguishing gas is reduced. This is because the pressure decrease of the pressurized arc-extinguishing gas causes reduction in the flow velocity of the arc-extinguishing gas, which is unlikely to extinguish the arc surely.

Accordingly, it is preferable that the separation distance (clearance) between the insulation nozzle 23 and the trigger electrode 31 is reduced to reduce the leakage of the arc-extinguishing gas when sprayed to the arc.

On the other hand, when the separation distance (clearance) between the insulation nozzle 23 and the trigger electrode 31 is reduced, the pressure decrease due to leakage of the pressurized arc-extinguishing gas is reduced. However, when the separation distance (clearance) between the insulation nozzle 23 and the trigger electrode 31 is too small, metal, an insulator, and the arc-extinguishing gas contact with one another at the throat portion 23a of the insulation nozzle 23, which creates a triple junction at which the electric field intensity becomes extremely high.

At the triple junction at which the metal, the insulator, and the arc-extinguishing gas contact with one another, the electric field intensity becomes extremely high, which may jeopardize the electric insulation performance of the gas circuit breaker 1.

It is preferable that the clearance distance between the insulation nozzle 23 and the trigger electrode 31 is larger than the clearance distance between the arc contactor (on the movable side) 41 and the trigger electrode 31. When the insulation nozzle 23 and the trigger electrode 31 contact with each other, a triple junction portion forming a high electric field is created, which causes considerable degradation of the electrical performance.

However, in the gas circuit breaker 1 according to the present embodiment, the step 521 on the inner wall 52 of the cylinder 42 is fitted into the step 231 on the insulation nozzle 23, so that the insulation nozzle 23 is supported by the inner wall 52 forming the cylinder 42. This reduces the deformation of the insulation nozzle 23. Accordingly, an opening diameter of the throat portion 23a of the insulation nozzle 23 is maintained at an appropriate diameter. Therefore, the breaking performance and electric insulation performance of the gas circuit breaker 1 is more surely maintained.

The deformation of the insulation nozzle 23 is reduced, and the opening diameter of the throat portion 23a is maintained at an appropriate diameter, which makes it possible to mitigate reduction in the spraying velocity of the arc-extinguishing gas due to the pressure decrease of the arc-extinguishing gas when sprayed to the arc.

In the conventional technique, there are many cases where the insulation nozzle 23 is provided in the movable contactor portion 3 together with the movable conductive contactor 32. However, it is preferable that the movable contactor portion 3 is reduced in weight to be movable. Accordingly, it is preferable that the insulation nozzle 23 is provided in the fixed contactor portion 2 that does not move. Note that the insulation nozzle 23 may be provided in the movable contactor portion 3.

The insulation nozzle 23 may be provided either in the fixed contactor portion 2 or the movable contactor portion 3, but the movable contactor portion 3 vibrates and receives an impact due to movement. Accordingly, electrical performance deterioration due to vibration and breakage of the insulation nozzle 23 due to mechanical impact can be suppressed in the case where the insulation nozzle 23 is provided in the fixed contactor portion 2 compared with the case where the insulation nozzle 23 is provided in the movable contactor portion 3.

Since the insulation nozzle 23 can suppress the flow of the arc-extinguishing gas with low insulation performance and a high temperature into the fixed conductive contactor 22, it is preferable that the insulation nozzle 23 is provided in the fixed contactor portion 2. It is preferable that a clearance distance between the insulation nozzle 23 and the trigger electrode 31 is larger than the clearance distance between the arc contactor (on the movable side) 41 and the trigger electrode 31 during contact therebetween.

This is to mitigate the fact that when the insulation nozzle 23 and the trigger electrode 31 contact with each other, a high electric field portion is created and considerable degradation of the electrical performance occurs. With the configuration described above, the deformation of the insulation nozzle 23 can be reduced, preventing contact between the trigger electrode 31 and the insulation nozzle 23.

In addition, the step 521 on the inner wall 52 of the cylinder 42 supports the step 231 on the insulation nozzle 23 via the O-ring 53. The O-ring 53 ensures air-tightness between the insulation nozzle 23 and the inner wall 52 forming the cylinder 42. This can suppress an amount of leakage of the arc-extinguishing gas from the pressure accumulating passage 38.

When spraying the arc-extinguishing gas to the arc generated between the arc contactor (on the movable side) 41 and the arc contactor (on the fixed side) 21, it is preferable that the insulation nozzle 23 has a lower internal pressure. Accordingly, it is preferable that the insulation nozzle 23 has a shape such that a cross-sectional area of the arc-extinguishing gas flow passage formed by the arc contactor (on the fixed side) 21 and the insulation nozzle 23 gradually increases toward the open-end direction.

According to the test results, it is preferable that the passage has the following configuration to obtain good breaking performance.

Area of the passage formed between the arc contactor (on the fixed side) 21 and the insulation nozzle 23>Area of the passage in the throat portion 23a of the insulation nozzle 23≥Area of an ejecting portion of the arc contactor (on the movable side) 41

Furthermore, it has been found that the area of the passage formed between the arc contactor (on the movable side) 41 and the insulation nozzle 23 has an appropriate value between 20% and 200% of the area of the ejecting portion of the arc contactor (on the movable side) 41. Such a configuration enables necessary and sufficient supply of the gas flow of the arc-extinguishing gas from the throat portion 23a of the insulation nozzle 23 toward the open-end direction while maximizing the arc cooling performance in the vicinity of the arc-extinguishing gas ejecting outlet of the arc contactor (on the movable side) 41.

The insulation nozzle 23 controls the arc-extinguishing gas sprayed via the compression chamber 36 and the pressure accumulating passage 38 to efficiently cool the arc. Since the pressure inside the insulation nozzle 23 becomes a downstream pressure when the arc-extinguishing gas is sprayed, it is preferable to provide a structure such that the insulation nozzle 23 is always maintained at a low pressure.

The insulation nozzle 23 not only creates the arc-extinguishing gas flow parallel to the axis from the driving-device direction side to the open-end direction side, but also creates the arc-extinguishing gas flow in a direction crossing the arc. The arc is efficiently cooled by this flow. Since the arc-extinguishing gas that has become a high temperature by being sprayed to the arc has low insulation performance, it is preferable that the arc-extinguishing gas is exhausted without contacting the fixed conductive contactor 22 and the movable conductive contactor 32.

The arc generated in the arc space between the arc contactor (on the fixed side) 21 and the arc contactor (on the movable side) 41 becomes very high temperature. The arc-extinguishing gas that has become a high temperature by being sprayed to the arc is exhausted into the sealed container 8 from the exhaust ports 24a and 24b of the exhaust cylinder 24.

The arc between the arc contactor (on the fixed side) 21 and the arc contactor (on the movable side) 41 is reduced in size at a current zero cross point of an alternating current supplied from the lead-out conductors 7a and 7b, and is extinguished by spraying the arc-extinguishing gas. As a result, the gas circuit breaker 1 becomes the opened state, and the current flowing in the lead-out conductors 7a and 7b are broken.

1-4. Effect (1) According to the present embodiment, the gas circuit breaker 1 that includes the first arc contactor 21 electrically connected to a first lead-out conductor 7a connected to a power system, the second arc contactor 41 electrically connected to a second lead-out conductor 7b, the trigger electrode 31 which is arranged to be movable between the first arc contactor 21 and the second arc contactor 41, which an arc generated between the first arc contactor 21 and the trigger electrode is ignited along with a movement in a first half of a current breaking action, and which ignites the arc on the second arc contactor 41 along with the movement in a latter half of the current breaking action, the compression chamber 36 for pressurizing arc-extinguishing gas, the compression chamber 36 being formed by the cylinder 42 which has the outer wall 51 and the inner wall 52, each being formed in a cylindrical shape, and which is provided to the second arc contactor 41, and the piston 33 that slides between the outer wall 51 and the inner wall 52 in conjunction with the trigger electrode 31, and the insulation nozzle 23 that guides the arc-extinguishing gas pressurized in the compression chamber 36 to an arc ignited between the first arc contactor 21 and the second arc contactor 41 can be provided, and since the insulation nozzle 23 is supported by the inner wall 52 of the cylinder 42, the deformation of the insulation nozzle 23 and the leakage of the arc-extinguishing gas compressed to be sprayed to the arc can be reduced, and the electric insulation performance can be more surely maintained.

In the case where the insulation nozzle 23 is not supported by the inner wall 52 of the cylinder 42, the insulation nozzle 23 is deformed in the outer circumferential direction when spraying the high-pressure arc-extinguishing gas that has reached a high temperature. Hereby, a gap is created between the insulation nozzle 23 and the inner wall 52 of the cylinder 42, which causes the leakage of the arc-extinguishing gas and the reduction in pressure of the arc-extinguishing gas. As a result, the breaking performance and electric insulation performance of the gas circuit breaker 1 are impaired.

However, according to the present embodiment, since the insulation nozzle 23 of the gas circuit breaker 1 is supported by the inner wall 52 of the cylinder 42, the deformation of the insulation nozzle 23 is suppressed even when the high-pressure arc-extinguishing gas that has reached a high temperature is sprayed. This suppresses creation of the gap between the insulation nozzle 23 and the inner wall 52 of the cylinder 42, and reduces the leakage of the arc-extinguishing gas. As a result, the pressure decrease of the arc-extinguishing gas is suppressed, and the breaking performance and electric insulation performance of the gas circuit breaker 1 is more surely maintained.

(2) According to the present embodiment, since the insulation nozzle 23 has the first step 231 on the outer circumference, the inner wall 52 of the cylinder 42 has the second step 521 on the inner circumference, and the insulation nozzle 23 is supported by the inner wall 52 forming the cylinder 42 by fitting the first step 231 into the second step 521, the gas circuit breaker 1 can be provided which can reduce the deformation of the insulation nozzle 23 and the leakage of the arc-extinguishing gas compressed to be sprayed to the arc, and can more surely maintain the electric insulation performance.

According to the present embodiment, since the outer circumference of the first step 231 on the insulation nozzle 23 is fitted into the inner circumference of the second step 521 on the inner wall 52 of the cylinder 42, and the insulation nozzle 23 is supported by the inner wall 52 of the cylinder 42, the deformation of the insulation nozzle 23 of the gas circuit breaker 1 in the outer circumferential direction is more surely suppressed.

It is preferable that the joining portion between the insulation nozzle 23 and the inner wall 52 and the inner wall 52 of the cylinder 42 are formed thin to reduce the pressure decrease of the arc-extinguishing gas compressed to be sprayed to the arc. It is preferable that the joining portion between the insulation nozzle 23 and the inner wall 52 and the inner wall 52 of the cylinder 42 are formed to have a thickness of about 15 mm or less.

If the joining portion between the insulation nozzle 23 and the inner wall 52 and the inner wall 52 of the cylinder 42 are formed thick, the deformation of the insulation nozzle 23 due to the high-pressure arc-extinguishing gas that has reached a high temperature is reduced. However, the pressure of the arc-extinguishing gas pressurized in the compression chamber 36 decreases when the arc-extinguishing gas flows into the pressure accumulating passage 38.

According to the present embodiment, the outer circumference of the first step 231 on the insulation nozzle 23 is fitted into the inner circumference of the second step 521 on the inner wall 52 of the cylinder 42, and the insulation nozzle 23 is supported by the inner wall 52 of the cylinder 42. Therefore, the joining portion between the insulation nozzle 23 and the inner wall 52 and the inner wall 52 of the cylinder 42 can be formed thin.

Since the joining portion between the insulation nozzle 23 and the inner wall 52 and the inner wall 52 of the cylinder 42 are formed thin, the pressure decrease of the arc-extinguishing gas when flowing into the pressure accumulating passage 38 from the compression chamber 36 can be reduced. As a result, the breaking performance and electric insulation performance of the gas circuit breaker 1 is more surely maintained.

(3) According to the present embodiment, since the insulation nozzle 23 is supported by the inner wall 52 forming the cylinder 42 via the O-ring 53, the gas circuit breaker 1 can be provided which can reduce the leakage of the arc-extinguishing gas at between the insulation nozzle 23 and the inner wall 52 of the cylinder 42 and can more surely maintain the electric insulation performance.

(4) According to the present embodiment, since the trigger electrode 31 is joined with the movable conductive contactor 32 forming a main contact where an arc generated in a current breaking action is not ignited, and the insulation nozzle 23 is supported by and joined to the inner wall 52 forming the cylinder 42 at a position separated from the generated arc with respect to the movable conductive contactor 32, the potential gradient at the joining portion between the insulation nozzle 23 and the inner wall 52 of the cylinder 42 is reduced. This mitigates the creation of the triple junction (triple point) in the joining portion between the insulation nozzle 23 and the inner wall 52 of the cylinder 42.

As a result, this can reduce the likelihood that the dielectric breakdown occurs at the joining portion between the insulation nozzle 23 and the inner wall 52 of the cylinder 42, and the breaking performance and electric insulation performance of the gas circuit breaker 1 can be more surely maintained.

2. Other Embodiments

Although the embodiment that includes the modified example thereof has been described, such embodiment is merely presented as an example, and is not intended to limit the scope of the present embodiment. Such embodiments can be implemented in other various forms, and various omissions, replacements, and modifications can be made without departing from the scope of the present embodiment. Such embodiment and the modified form thereof are within the scope of the present embodiment and also within the scope of the invention as recited in the appended claims and the equivalent range thereto. The followings are examples thereof.

Figure 5:
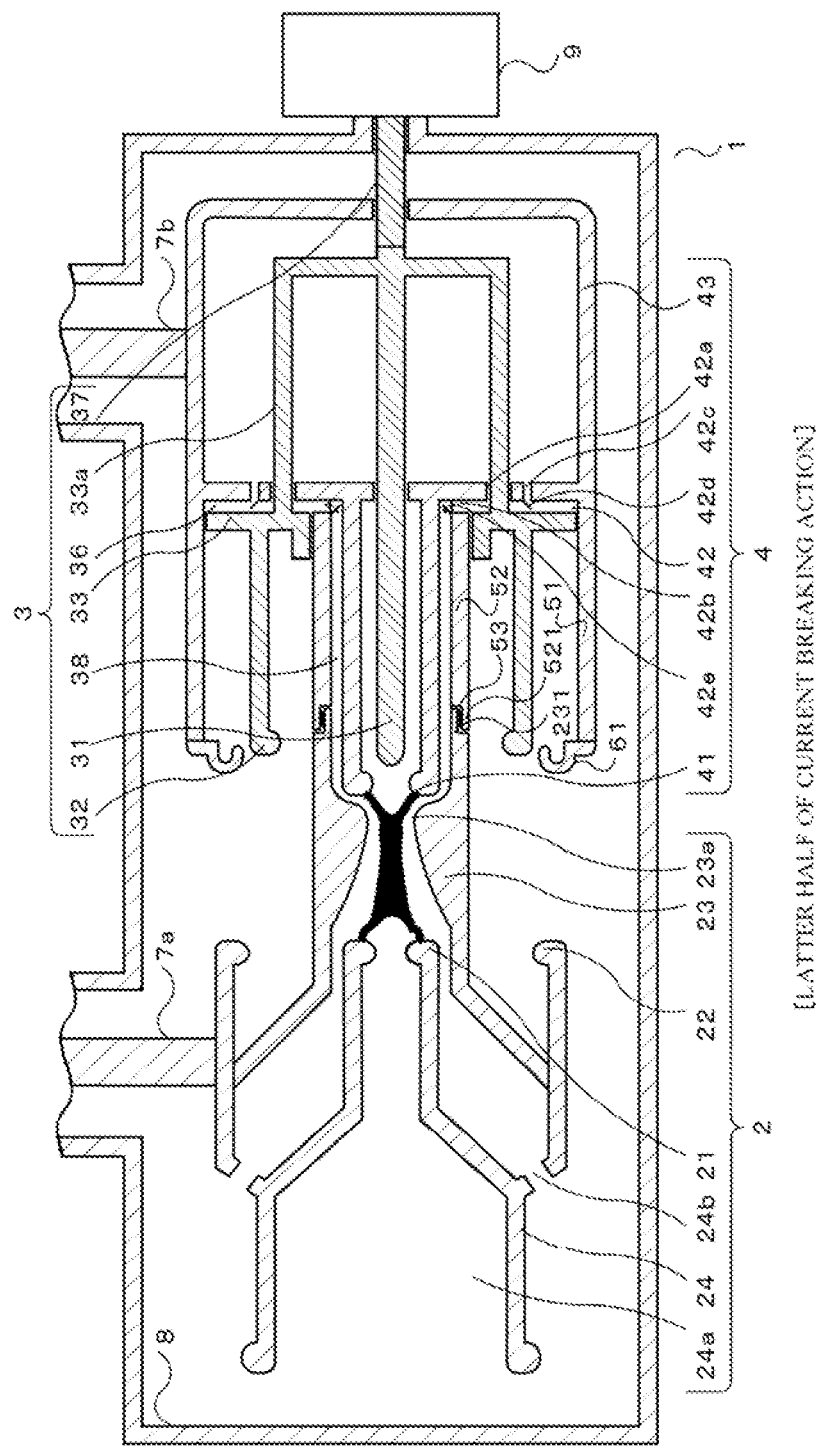
FIG. 5 is a diagram illustrating a latter half of a current breaking action of a gas circuit breaker according to another embodiment.

(1) As illustrated in FIG. 5, the gas circuit breaker 1 may be provided with the electrostatic shield 61 that reduce the potential gradient at the joining portion between the insulation nozzle 23 and the inner wall 52 of the cylinder 42. The electrostatic shield 61 is a member extending from the outer wall 51 of the cylinder 42 in a direction of the movable conductive contactor 32. The cross section of the electrostatic shield 61 is formed into a semi-circular shape protruding in the open-end direction.

The electrostatic shield 61 is fixed to the outer wall 51 of the cylinder 42 by a fixing member (not illustrated) such as a bolt. In addition, the electrostatic shield 61 may be formed integrally with the outer wall 51 of the cylinder 42. The electrostatic shield 61 is arranged to surround the movable conductive contactor 32. The electrostatic shield 61 is made of a conductive material such as aluminum, iron, or copper.

The electrostatic shield 61 is arranged on the open-end direction side with respect to the joining portion between the insulation nozzle 23 and the inner wall 52 of the cylinder 42. The electrostatic shield 61 concentrates the potential gradient between the electrostatic shield 61 and the arc contactor (on the fixed side) 21 of the fixed contactor portion 2 and between the electrostatic shield 61 and the fixed conductive contactor 22 of the fixed contactor portion 2. The electrostatic shield 61 reduces the potential gradient on the driving-device direction side with respect to the electrostatic shield 61.

Accordingly, the potential gradient at the joining portion between the insulation nozzle 23 and the inner wall 52 of the cylinder 42 is reduced. This mitigates the creation of the triple junction (triple point) in the joining portion between the insulation nozzle 23 and the inner wall 52 of the cylinder 42.

As a result, this can reduce the likelihood that the dielectric breakdown occurs at the joining portion between the insulation nozzle 23 and the inner wall 52 of the cylinder 42, and the breaking performance and electric insulation performance of the gas circuit breaker 1 can be more surely maintained.

The electrostatic shield 61 is effective when the movable conductive contactor 32 is positioned on the driving-device direction side with respect to the joining portion between the insulation nozzle 23 and the inner wall 52 of the cylinder 42 in particular in the current breaking action of the gas circuit breaker 1.

(2) In the above-described embodiment, the fixed contactor portion 2 and the fixed contactor portion 4 are fixed to the sealed container 8, but the fixed contactor portion 2 and the fixed contactor portion 4 may be movable. When the gas circuit breaker 1 becomes the opened state, for example, the fixed contactor portion 2 may be movable in the open-end direction. In addition, the fixed contactor portion 4 may be movable in the driving-device direction. When the fixed contactor portion 2 or 4 or the fixed contactor portion 2 and 4 are movable, the power between the lead-out conductors 7a and 7b can be broken more quickly.

REFERENCE SIGNS LIST

1 Gas circuit breaker
2, 4 Fixed contactor portion
3 Movable contactor portion
7a, 7b Lead-out conductor
8 Sealed container
9 Driving device
21 Arc contactor (on a fixed side)
22 Fixed conductive contactor
23 Insulation nozzle
23a Throat portion
24 Exhaust cylinder
24a, 24b Exhaust port
31 Trigger electrode
32 Movable conductive contactor
33 Piston
33a Piston support
36 Compression chamber
37 Insulation rod
38 Pressure accumulating passage
41 Arc contactor (on a movable side)
42 Cylinder
42a Insertion hole
42b Through hole
42c Intake hole
42d Air intake valve
42e Check valve
43 Support
51 Outer wall
52 Inner wall
53 O-ring
61 Electrostatic shield
231, 521 Step

The invention claimed is:

1. A gas circuit breaker, comprising:
a first arc contactor electrically connected to a first lead-out conductor connected to a power system;
a second arc contactor electrically connected to a second lead-out conductor;
a trigger electrode which is arranged to be movable between the first arc contactor and the second arc contactor, which ignites an arc generated between the first arc contactor and the trigger electrode along with a movement in a first half of a current breaking action, and which ignites the arc on the second arc contactor along with the movement in a latter half of the current breaking action;
a compression chamber for pressurizing arc-extinguishing gas, the compression chamber being formed by:
a cylinder which has an outer wall and an inner wall, each being formed in a cylindrical shape, and which is provided to the second arc contactor; and
a piston that slides between the outer wall and the inner wall in conjunction with the trigger electrode; and
an insulation nozzle that guides the arc-extinguishing gas pressurized in the compression chamber to an arc ignited between the first arc contactor and the second arc contactor,
wherein the insulation nozzle is supported by the inner wall of the cylinder.

2. The gas circuit breaker according to claim 1, wherein the insulation nozzle has a first step on an outer circumference, the inner wall of the cylinder has a second step on an inner circumference, and
the insulation nozzle is supported by the inner wall forming the cylinder by fitting the first step into the second step.

3. The gas circuit breaker according to claim 2, wherein the insulation nozzle is supported by the inner wall forming the cylinder via an O-ring.

4. The gas circuit breaker according to claim 2, wherein
the trigger electrode is joined with a movable conductive contactor forming a main contact where an arc generated in the current breaking action is not ignited, and
the insulation nozzle is supported by and joined to the inner wall forming the cylinder at a position separated from the generated arc with respect to the movable conductive contactor.

5. The gas circuit breaker according to claim 2, wherein
the trigger electrode is joined with a movable conductive contactor forming a main contact where an arc generated in the current breaking action is not ignited, and
the outer wall of the cylinder includes an electrostatic shield that surrounds a movable conductive contactor, and
the insulation nozzle is supported by and joined to the inner wall forming the cylinder at a position separated from the generated arc with respect to the electrostatic shield.

6. The gas circuit breaker according to claim 1, wherein
the insulation nozzle is supported by the inner wall forming the cylinder via an O-ring.

7. The gas circuit breaker according to claim 6, wherein
the trigger electrode is joined with a movable conductive contactor forming a main contact where an arc generated in the current breaking action is not ignited, and
the insulation nozzle is supported by and joined to the inner wall forming the cylinder at a position separated from the generated arc with respect to the movable conductive contactor.

8. The gas circuit breaker according to claim 6, wherein
the trigger electrode is joined with a movable conductive contactor forming a main contact where an arc generated in the current breaking action is not ignited, and
the outer wall of the cylinder includes an electrostatic shield that surrounds a movable conductive contactor, and
the insulation nozzle is supported by and joined to the inner wall forming the cylinder at a position separated from the generated arc with respect to the electrostatic shield.

9. The gas circuit breaker according to claim 1, wherein
the trigger electrode is joined with a movable conductive contactor forming a main contact where an arc generated in the current breaking action is not ignited, and
the insulation nozzle is supported by and joined to the inner wall forming the cylinder at a position separated from the generated arc with respect to the movable conductive contactor.

10. The gas circuit breaker according to claim 9, wherein
the outer wall of the cylinder includes an electrostatic shield that surrounds a movable conductive contactor, and
the insulation nozzle is supported by and joined to the inner wall forming the cylinder at a position separated from the generated arc with respect to the electrostatic shield.

11. The gas circuit breaker according to claim 1, wherein
the trigger electrode is joined with a movable conductive contactor forming a main contact where an arc generated in the current breaking action is not ignited, and
the outer wall of the cylinder includes an electrostatic shield that surrounds a movable conductive contactor, and
the insulation nozzle is supported by and joined to the inner wall forming the cylinder at a position separated from the generated arc with respect to the electrostatic shield.

* * * * *